(12) United States Patent
Nakata

(10) Patent No.: US 11,211,764 B2
(45) Date of Patent: Dec. 28, 2021

(54) RAMAN OPTICAL AMPLIFIER AND RAMAN OPTICAL AMPLIFICATION METHOD

(71) Applicant: FUJITSU LIMITED, Kawasaki (JP)

(72) Inventor: Masao Nakata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 437 days.

(21) Appl. No.: 16/391,584

(22) Filed: Apr. 23, 2019

(65) Prior Publication Data
US 2019/0372298 A1 Dec. 5, 2019

(30) Foreign Application Priority Data

Jun. 4, 2018 (JP) .............................. JP2018-106900

(51) Int. Cl.
| | |
|---|---|
| H01S 3/067 | (2006.01) |
| H01S 3/30 | (2006.01) |
| H01S 3/094 | (2006.01) |
| H01S 5/50 | (2006.01) |
| G02B 6/26 | (2006.01) |

(52) U.S. Cl.
CPC ............ H01S 3/06754 (2013.01); G02B 6/26 (2013.01); H01S 3/094096 (2013.01); H01S 3/302 (2013.01); H01S 5/50 (2013.01); *H01S 2301/04* (2013.01)

(58) Field of Classification Search
None
See application file for complete search history.

(56) References Cited

U.S. PATENT DOCUMENTS

| | | | | |
|---|---|---|---|---|
| 7,554,721 B2* | 6/2009 | Hiraizumi | ........... | H01S 3/06754 359/341.41 |
| 8,213,078 B2* | 7/2012 | Hiraizumi | ........... | H01S 3/06754 359/341.41 |
| 2002/0145796 A1 | 10/2002 | Kikuchi et al. | | |
| 2004/0196158 A1 | 10/2004 | Sugaya et al. | | |
| 2005/0024712 A1* | 2/2005 | Hiraizumi | ............. | H01S 3/0912 359/334 |

FOREIGN PATENT DOCUMENTS

| | | |
|---|---|---|
| JP | 2001-109025 | 4/2001 |
| JP | 2002-303896 | 10/2002 |
| JP | 2004-287307 | 10/2004 |

* cited by examiner

Primary Examiner — Eric L Bolda
(74) Attorney, Agent, or Firm — Fujitsu Patent Center

(57) ABSTRACT

An amplifier includes a first monitor configured to measure first optical power including first signal light and ASS light of a first wavelength band propagated through the amplification medium, and a processor configured to calculate the first ASS light power corresponding to the first excitation light power, based on the determined first model formula, calculate the second ASS light power corresponding to the second excitation light power, based on the determined second model formula, calculate the first signal light power by subtracting the calculated first ASS light power and second ASS light power from the first optical power measured by the first monitor, and calculate a difference between the calculated first signal light power and first target signal light power, and controll a first excitation light source or a second excitation light source to adjust the first excitation light power or the second excitation light power based on the difference.

14 Claims, 27 Drawing Sheets

FIG. 7A

| EXCITATION LIGHT SOURCE | FIRST EXCITATION LIGHT WAVELENGTH | FIRST WAVELENGTH DIFFERENCE | | ASS LIGHT POWER RELATIVE RATIO | | INTEGRATED VALUE A11i' OF ASS LIGHT POWER |
|---|---|---|---|---|---|---|
| | | $\Delta\lambda(11,i)$ | $\Delta\lambda(12,i)$ | R1(101i) | R2(101i) | |
| 101A | 1421 | 109 | 144 | 0.793 | 0.149 | 1.646 |
| 101B | 1432 | 98 | 133 | 0.989 | 0.297 | 2.839 |
| 101C | 1456 | 74 | 109 | 0.676 | 0.894 | 4.218 |
| 101D | 1463 | 67 | 102 | 0.578 | 0.969 | 3.907 | i=1~4

FIG. 7B

| EXCITATION LIGHT SOURCE | SECOND EXCITATION LIGHT WAVELENGTH | SECOND WAVELENGTH DIFFERENCE | | ASS LIGHT POWER RELATIVE RATIO | | INTEGRATED VALUE A12j' OF ASS LIGHT POWER |
|---|---|---|---|---|---|---|
| | | $\Delta\lambda(11,j)$ | $\Delta\lambda(12,j)$ | R1(111j) | R2(111j) | |
| 111A | 1470 | 60 | 95 | 0.480 | 0.960 | 3.463 |
| 111B | 1489 | 41 | 76 | 0.290 | 0.700 | 2.239 |
| 111C | 1498 | 32 | 67 | 0.275 | 0.579 | 1.807 | j=1~3

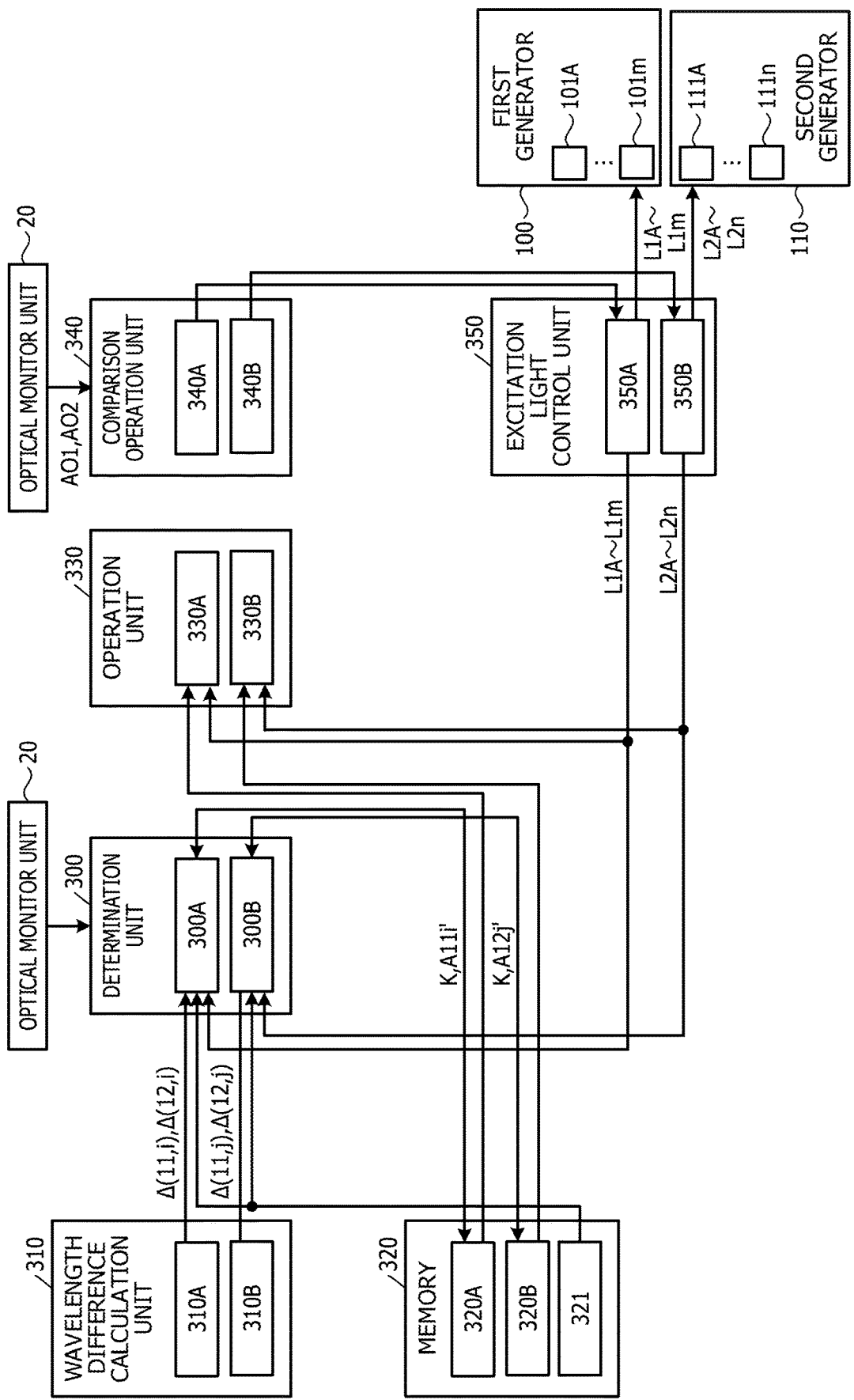

RAMAN OPTICAL AMPLIFIER AND RAMAN OPTICAL AMPLIFICATION METHOD

CROSS-REFERENCE TO RELATED APPLICATION

This application is based upon and claims the benefit of priority of the prior Japanese Patent Application No. 2018-106900, filed on Jun. 4, 2018, the entire contents of which are incorporated herein by reference.

FIELD

The embodiments discussed herein are related to a Raman optical amplifier and a Raman optical amplification method.

BACKGROUND

There is, for example, a wavelength division multiplexing (WDM) system for transmitting large amounts of information by multiplexing a plurality of optical signals of different wavelengths through a transmission optical fiber. In the WDM system, the longer the installation interval between optical amplifiers for amplification relay on the transmission optical fiber, the larger the section loss of the transmission optical fiber for transmitting the WDM signal. For this reason, a signal-to-noise ratio is lowered in low optical power transmission. Therefore, the WDM system uses a Raman optical amplifier to improve the signal-to-noise ratio.

The Raman optical amplifier may achieve an optical gain in a band section from a wavelength of excitation light to the long-wavelength side of about 130 nm, because of a Raman effect generated by supplying intense excitation light to the transmission optical fiber. Wavelength characteristics of the Raman gain are approximately triangular-shaped gain characteristics with a peak wavelength away from the excitation light wavelength by 100 nm, in which the band section from the peak wavelength to the excitation light wavelength is gradually attenuated. Therefore, in the case of amplification of the WDM signal using the Raman optical amplifier, excitation light of more than one wavelength is used so as to achieve a flat optical gain within the wavelength band of the WDM signal.

However, in the Raman optical amplifier, while WDM signal light of a predetermined band is amplified by the Raman effect, amplified spontaneous Raman scattering emission (ASS) light is generated as noise light by the Raman effect. As a result, the result of monitoring optical power of a signal band after Raman amplification includes the WDM signal light and the ASS light generated by the Raman effect. In the WDM system to which the Raman optical amplifier is applied, a technique to accurately calculating the ASS light power is important for accurate acquisition of the WDM signal light power after Raman amplification.

Related techniques are disclosed in, for example, Japanese Laid-open Patent Publication Nos. 2004-287307, 2002-303896, and 2001-109025, and the like.

The Raman optical amplifier that accurately calculates the ASS light power measures ASS light power generated when excitation light is supplied to a transmission optical fiber to be an amplification medium before start of operation. Then, the Raman optical amplifier acquires, for each type of the transmission optical fiber, coefficients of a model formula for calculating the ASS light power from excitation light power, based on the measurement result. Accordingly, the Raman optical amplifier calculates the ASS light power corresponding to the excitation light power from the acquired model formula.

In the WDM system, an operation is assumed, in which a C band (1530 nm to 1565 nm) is used as an existing band and an L band (1570 nm to 1605 nm) is used as an added band. In this case, wavelength characteristics of the ASS light generated by the Raman effect resulting from the excitation light are the same as the Raman gain wavelength characteristics, with a peak wavelength away from the excitation light wavelength by about 100 nm, in which the band section from the peak wavelength to the excitation light wavelength is gradually attenuated. As a result, when excitation light is added for Raman amplification of the added L band, ASS light power to be generated in the C band is increased by the excitation light for the L band amplification.

FIG. 23A is an explanatory diagram illustrating an example of wavelength characteristics of WDM signal light power and ASS light power for Raman amplification in the C band that is the existing band. It is assumed that the C band is used as the existing band, and excitation light power is controlled such that an average Raman gain in the C band is 10 dB. In FIG. 23A, when the excitation light power used for Raman amplification of the C band is 400 mW, ASS light power generated by the Raman effect is 25 dBm. In this event, ASS light power calculated using the model formula is also −25 dBm. FIG. 23B is an explanatory diagram illustrating an example of wavelength characteristics of WDM signal light power and ASS light power for Raman amplification in the L band that is the added band. It is assumed that the L band is used as the added band, without taking into consideration the C band, and excitation light is added for Raman amplification of the L band. ASS light by the Raman amplification of the L band has its peak at a wavelength away from the excitation light wavelength by about 100 nm, and a band section from the peak wavelength to the excitation light wavelength is gradually attenuated. Thus, ASS light is also generated in the C band. FIG. 23C is an explanatory diagram illustrating an example of wavelength characteristics of WDM signal light power and ASS light power for Raman amplification in the C band and L band. As for wavelength characteristics of ASS light power generated by addition of the L band during operation of the C band, wavelength characteristics illustrated in FIG. 23C are obtained by adding the ASS light power wavelength characteristics illustrated in FIG. 23B generated by the addition of the L band to the ASS light power wavelength characteristics illustrated in FIG. 23A. As a result, the addition of the L band causes a large difference between the ASS light power generated in the C band and the ASS light power generated in the C band with the excitation light after the addition of the band, which are calculated using the model formula determined before start of initial operation of the WDM system and the excitation light power.

FIG. 24A is an explanatory diagram illustrating an example of ASS light power generated in the existing C band for each excitation light power for Raman amplification in the existing C band. When the excitation light power for Raman amplification of the C band in operation is 400 mW, for example, ASS light power of −25 dBm is generated in the C band as illustrated in FIG. 24A. FIG. 24B is an explanatory diagram illustrating an example of ASS light power in the existing C band by addition of L-band excitation light. When the L-band excitation light for Raman amplification of the L band is additionally supplied to the same transmission optical fiber in a state where the excitation light power for Raman amplification of the C band is 400 mW, ASS light power generated in the C band is also changed for each excitation light power. For example, before addition of the excitation light power for Raman amplification of the L band, that is, when the excitation light power is 0 mW, the ASS light power generated in the C band is −25 dBm, corresponding to the excitation light power 400 mW for Raman amplification of the C band. When the excitation light power for Raman amplification of the added L band is 300 mW, the ASS light power generated in the C band is −23.0 dBm. In the calculation method using the model formula, on the other hand, the ASS light power corresponding to the excitation light power for C-band amplification before addition is −25 dBm, while the ASS light power corresponding to the excitation light power for L-band amplification after addition is −23.0 dBm. Therefore, the ASS light power before addition is calculated to be smaller than the ASS light power after addition, resulting in an error in the ASS light power calculation result.

The following problem occurs when actually generated ASS light power is smaller than the calculated value of the ASS light power. FIG. 25 is an explanatory diagram illustrating an example of a problem caused in the event of addition of the L-band excitation light for amplification of the added L band. An operation state is assumed, for example, in which the L band is added because of insufficient transmission capacity by the C band alone, and a failure or the like caused in a transmission device of the C band after the addition of the L band reduces the wavelength of the WDM signal of the C band. In this case, as for power control of the optical power of the WDM signal, the excitation light power of the Raman optical amplifier is controlled such that an optical power monitor value after Raman amplification corresponds to a target optical power sum. The optical power monitor value is the sum of the signal light power of the WDM signal, the ASS light power generated by the excitation light for Raman amplification of the L band, and the ASS light power generated by the excitation light for Raman amplification of the C band. Meanwhile, the target optical power sum is the sum of the target signal light power of the WDM signal and the ASS light power calculated using the model formula.

In FIG. 25, for example, when the target signal light power of the WDM signal is −25 dBm and the excitation light power for C-band amplification is 400 mW, the ASS light power calculated using the model formula is −25 dBm. Also, actual ASS light power is −23.0 dBm when the excitation light power for amplification of the added L band is 300 mW. In this case, the WDM signal light power of −29.0 dBm is obtained by subtracting −23.0 dBm that is the actually generated ASS light power from −22 dBm that is the sum of the target WDM signal light power and the ASS light power calculated using the model formula. As a result, the actual WDM signal light power (−29.0 dBm) is lower than the target signal light power (−25 dBm). That is, the WDM signal light power generated by Raman amplification is less than signal power with stable transmission performance of the WDM system. Therefore, the addition of the L band lowers the signal-to-noise ratio of the WDM signal of the C band, leading to deteriorated transmission performance.

The following problem occurs when a model formula is acquired by measuring ASS light power generated by the excitation light of the added L band, with optical power monitors of the C and L bands, before start of operation of the added L band. Since a ratio of the ASS light power to the WDM signal light power is small during operation of the C-band WDM signal, an increase in ASS light power generated in the C band by addition of the L-band excitation light may not be accurately measured. In order to measure the ASS light power generated in the C band, it is desirable to interrupt the C-band WDM signal once and return to the preparatory stage before the start of operation. Therefore, it is desirable to suspend services of the optical transmission system.

A method for measuring ASS light power under various excitation light power conditions is also conceivable for a plurality of excitation lights for Raman amplification of the C and L bands, respectively, assuming addition of a band, before start of operation of the existing band in the WDM system. However, initial cost is increased, since it is desirable to prepare a Raman optical amplifier and an excitation light source for the added band during initial building.

In consideration of the above problems, it is desirable to provide a Raman optical amplifier and the like capable of ensuring stable transmission performance even when a wavelength band is added.

SUMMARY

According to an aspect of the embodiments, an apparatus includes a Raman optical amplifier for amplifying signal light by a Raman effect occurring in an amplification medium, includes a first excitation light source configured to generate first excitation light for amplifying signal light of a first wavelength band among the signal light, a second excitation light source configured to generate second excitation light for amplifying signal light of a second wavelength band among the signal light, a first optical monitor configured to measure first optical power including first signal light and amplified spontaneous Raman scattering emission (ASS) light of the first wavelength band propagated through the amplification medium, and a processor configured to perform determining a first model formula associating the first excitation light power with first ASS light power generated in the first wavelength band with the first excitation light, determining a second model formula associating the second excitation light power with second ASS light power generated in the first wavelength band with the second excitation light, calculating the first ASS light power corresponding to the first excitation light power, based on the determined first model formula, calculating the second ASS light power corresponding to the second excitation light power, based on the determined second model formula, calculating the first signal light power by subtracting the calculated first ASS light power and second ASS light power from the first optical power measured by the first optical monitor, and calculating a difference between the calculated first signal light power and first target signal light power, and controlling the first excitation light source or the second excitation light source to adjust the first excitation light power or the second excitation light power supplied to the amplification medium, based on the difference between the first signal light power and the first target signal light power.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7A is an explanatory diagram illustrating an example of wavelength characteristics of excitation light generated by a first generator;

FIG. 7B is an explanatory diagram illustrating an example of wavelength characteristics of excitation light generated by a second generator;

FIG. 21 is an explanatory diagram illustrating an example of a functional configuration of a controller according to Embodiment 6;

DESCRIPTION OF EMBODIMENTS

Hereinafter, with reference to the drawings, detailed description is given of embodiments of a Raman optical amplifier and a Raman optical amplification method disclosed in the present application. The respective embodiments are not intended to limit the disclosed technology but may be combined as appropriate without causing any inconsistency.

Embodiment 1

Figure 1:
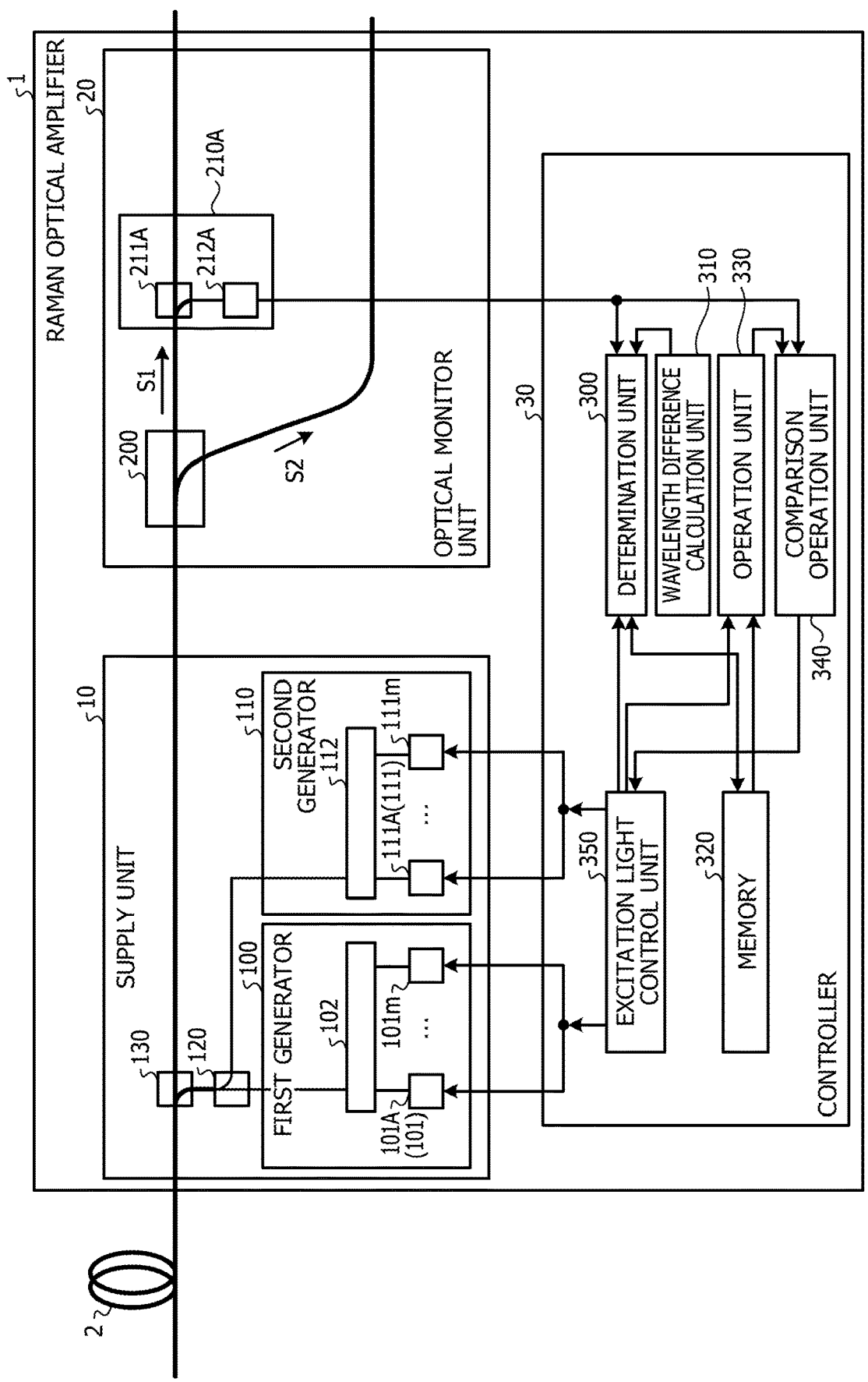
FIG. 1 is an explanatory diagram illustrating an example of a Raman optical amplifier according to Embodiment 1.

FIG. 1 is an explanatory diagram illustrating an example of a Raman optical amplifier 1 according to Embodiment 1. The Raman optical amplifier 1 illustrated in FIG. 1 is connected to a transmission optical fiber 2 that serves as an amplification medium, and amplifies signal light to be transmitted through the transmission optical fiber 2 before outputting the signal light to another transmission optical fiber. The Raman optical amplifier 1 includes a supply unit 10, an optical monitor unit 20, and a controller 30. The supply unit 10 supplies excitation light for Raman amplification to the transmission optical fiber 2. The optical monitor unit 20 monitors signal light power of WDM signal light and ASS light power by a Raman effect. The controller 30 controls the entire Raman optical amplifier 1. The controller 30 acquires optical power including excitation light power of the excitation light to be supplied to the transmission optical fiber 2, as well as the signal light power and ASS light power monitored by the optical monitor unit 20, to determine a model formula associating the excitation light power with the ASS light power. Furthermore, the controller 30 calculates the ASS light power generated in the transmission optical fiber 2 as a function of the excitation light power.

The supply unit 10 includes a first generator 100, a second generator 110, an optical multiplexer 120, and a WDM coupler 130. The first generator 100 includes a Raman gain peak in a first wavelength band of the WDM signal light, and generates first excitation light for Raman amplification of the first wavelength band. The first wavelength band is, for example, a C-wavelength band, which is an existing band. The second generator 110 includes a Raman gain peak in a second wavelength band of the WDM signal light, and generates second excitation light for Raman amplification of the second wavelength band. The second wavelength band is, for example, an L-wavelength band, which is an added band to be added to the existing band in operation. The optical multiplexer 120 outputs synthesized excitation light L12 by combining first synthesized excitation light L1 from the first generator 100 with second synthesized excitation light L2 from the second generator 110. The WDM coupler 130 outputs the synthesized excitation light L12 to the transmission optical fiber 2 that serves as the amplification medium, and also outputs first WDM signal light S1 of the first wavelength band and second WDM signal light S2 of the second wavelength band inputted from the transmission optical fiber 2 to the optical monitor unit 20.

The first generator 100 includes m excitation light sources 101A to 101m and a first optical multiplexer 102. The respective excitation light sources 101A to 101m output first excitation light of different wavelengths to the first optical multiplexer 102. The first optical multiplexer 102 generates first synthesized excitation light L1 by combining the first excitation light outputted from the respective excitation light sources 101A to 101m, and outputs the first synthesized excitation light L1 to the optical multiplexer 120. The second generator 110 includes n excitation light sources 111A to 111n and a second optical multiplexer 112. The respective excitation light sources 111A to 111n output second excitation light of different wavelengths to the second optical multiplexer 112. The second optical multiplexer 112 generates second synthesized excitation light L2 by combining the second excitation light outputted from the respective excitation light sources 111A to 111n, and outputs the second synthesized excitation light L2 to the optical multiplexer 120. For convenience of explanation, the first generator 100 and the second generator 110 are provided separately from each other. However, the first generator 100 and the second generator 110 may be integrated with each other, and thus the configuration may be modified accordingly.

The optical monitor unit 20 includes a WDM filter 200 and a first optical monitor section 210A. The WDM filter 200 branches the light into the first WDM signal light S1 of the first wavelength band that is the existing band and the second WDM signal light S2 of the second wavelength band that is the added band. The first optical monitor section 210A branches and monitors a part of optical power of the first WDM signal light S1 of the first wavelength band branched by the WDM filter 200. The first optical monitor section 210A includes a first optical demultiplexer 211A and a first light receiving element 212A. The first optical demultiplexer 211A branches a part of first optical power SA1 including first ASS light and the first WDM signal light S1 of the first wavelength band outputted from the WDM filter 200. The first light receiving element 212A is an element that monitors the first optical power SA1 outputted from the first optical demultiplexer 211A.

Figure 2:
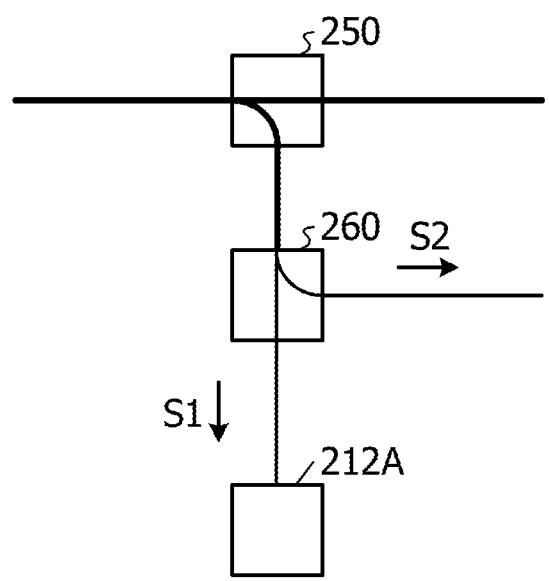
FIG. 2 is an explanatory diagram illustrating an alternative example of an optical monitor unit in the Raman optical amplifier according to Embodiment 1.

FIG. 2 is an explanatory diagram illustrating an alternative example of the optical monitor unit 20 in the Raman optical amplifier 1 according to Embodiment 1. The optical monitor unit 20 is not limited to the configuration illustrated in FIG. 1, but may include, for example, an optical demultiplexer 250, a WDM filter 260, and the first light receiving element 212A, instead of the WDM filter 200 and the first optical monitor section 210A, as illustrated in FIG. 2. The optical demultiplexer 250 branches a part of first and second WDM signal light of the first and second wavelength bands to be outputted to the subsequent stage from the supply unit 10. The WDM filter 260 branches the WDM signal light outputted from the optical demultiplexer 250 into the first WDM signal light S1 of the first wavelength band and the second WDM signal light S2 of the second wavelength band, and outputs the branched first WDM signal light S1 to the first light receiving element 212A. The first light receiving element 212A monitors the first optical power SA1 including the first WDM signal light S1 and the first ASS light.

The controller 30 includes a determination unit 300, a wavelength difference calculation unit 310, a memory 320, an operation unit 330, a comparison operation unit 340, and an excitation light control unit 350. The determination unit 300 determines a model formula associating excitation light power to be supplied to the transmission optical fiber 2 by the first generator 100 or the second generator 110 with ASS light power to be generated. The wavelength difference calculation unit 310 calculates a wavelength difference between an end-to-end wavelength of the wavelength band of the WDM signal light and the wavelength of the excitation light from the first generator 100 or the second generator 110. The memory 320 stores the model formula associating the excitation light power with the ASS light power. The operation unit 330 uses the model formula stored in the memory 320 and the excitation light power to calculate ASS light power to be generated in the wavelength band of the WDM signal light.

The comparison operation unit 340 compares an optical power sum that is the sum of the ASS light power calculated by the operation unit 330 and target WDM signal light power with actual total optical power (optical power monitor value) including the actual WDM signal light and actual ASS light monitored by the optical monitor unit 20. The comparison operation unit 340 generates a control signal for the excitation light power such that the optical power sum matches the actual total optical power (optical power monitor value). The excitation light control unit 350 adjusts optical power of the excitation light from the excitation light source 101 or 111 according to the control signal from the comparison operation unit 340. The excitation light control unit 350 outputs the excitation light power of the excitation light to be supplied to the transmission optical fiber 2 to the operation unit 330.

The memory 320 includes a first memory 320A, a second memory 320B, and a wavelength characteristic memory 321. The first memory 320A stores, for example, a first model formula for calculating first ASS light power A11. The first ASS light power A11 is ASS light power to be generated in the first wavelength band with the first synthesized excitation light L1. The second memory 320B stores, for example, a second model formula for calculating second ASS light power A12. The second ASS light power A12 is ASS light power to be generated in the first wavelength band with the second synthesized excitation light L2. The wavelength characteristic memory 321 stores wavelength characteristics of the ASS light power to be described later with respect to the excitation light wavelength.

The controller 30 is realized, for example, by a central processing unit (CPU) or the like, which is executed by software processing and has software installed therein. The memory 320 storing the model formulas related to the operation of the ASS light power may include an external memory and the like, such as a random access memory (RAM) inside the CPU or a dynamic random access memory (DRAM) outside the CPU.

Figure 3:
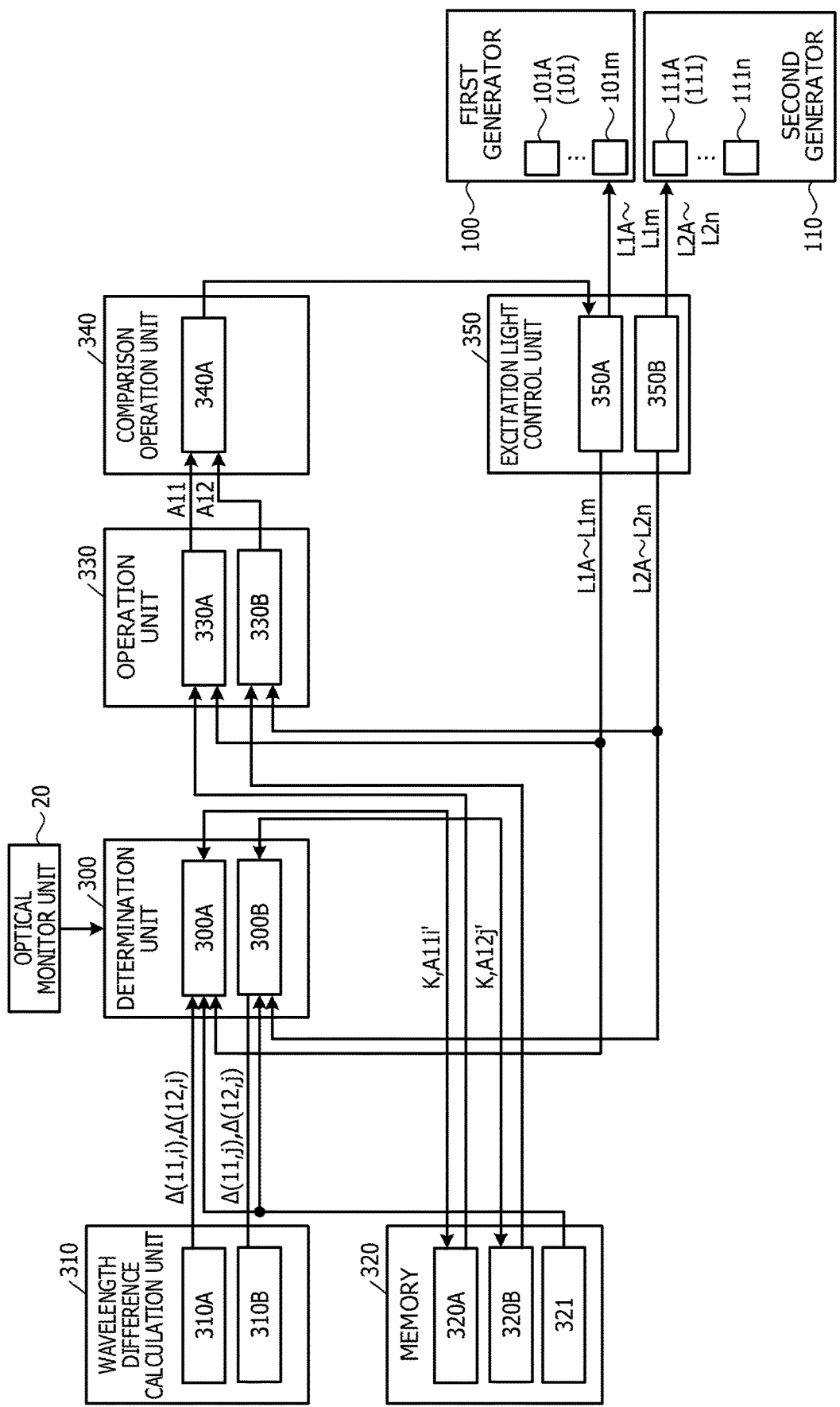
FIG. 3 is an explanatory diagram illustrating an example of a functional configuration of a controller according to Embodiment 1.

FIG. 3 is an explanatory diagram illustrating an example of a functional configuration of the controller 30 according to Embodiment 1. The determination unit 300 illustrated in FIG. 3 includes a first determination section 300A and a second determination section 300B. The first determination section 300A determines, for example, the first model formula for calculating the first ASS light power A11 to be generated in the first wavelength band with the first synthesized excitation light L1 supplied to the transmission optical fiber 2 by the first generator 100. The second determination section 300B determines the second model formula for calculating the second ASS light power A12 to be generated in the first wavelength band with the second synthesized excitation light L2 supplied to the transmission optical fiber 2 by the second generator 110.

The wavelength difference calculation unit 310 includes a first wavelength difference calculation section 310A and a second wavelength difference calculation section 310B. The first wavelength difference calculation section 310A calculates, for example, first wavelength differences $\Delta\lambda$ (11, i) and $\Delta\lambda$ (12, i) between end-to-end wavelengths $\lambda$11 and $\lambda$12 of the first wavelength band and the excitation light wavelength of the excitation light source 101$i$ (i=A to m) in the first generator 100, for each excitation light wavelength. The second wavelength difference calculation section 310B calculates second wavelength differences $\Delta\lambda$ (11, j) and $\Delta\lambda$ (12, j) between the end-to-end wavelengths $\lambda$11 and $\lambda$12 of the first wavelength band and the excitation light wavelength of the excitation light source 111$j$ (j=1 to n) in the second generator 110, for each excitation light wavelength. The wavelength difference calculated by the wavelength difference calculation unit 310 may be accordingly changed to a frequency difference between a frequency at both ends of the first wavelength band and a frequency of the excitation light.

The first determination section 300A monitors the first optical power SA1 of the first wavelength band with the first light receiving element 212A in the optical monitor unit 20, and acquires the monitoring result. The first optical power SA1 includes the first WDM signal light power S1 and the first ASS light power. The first determination section 300A measures, for example, the first ASS light power A11 generated in the first wavelength band by supplying the first synthesized excitation light L1 to the transmission optical fiber 2 in a preparatory stage before start of operation for initial introduction of the first wavelength band into a WDM system. The first determination section 300A uses the excitation light power of the first synthesized excitation light L1, the first ASS light power A11 as the measurement result, and the first wavelength differences $\Delta\lambda$ (11, i) and $\Delta\lambda$ (12, i) to determine the first model formula of the first ASS light power A11. The first determination section 300A stores the determined first model formula of the first ASS light power A11 in the first memory 320A.

The second determination section 300B uses the excitation light power of the second synthesized excitation light L2 and the second wavelength differences $\Delta\lambda$ (11, j) and $\Delta\lambda$ (12, j) to determine the second model formula of the second ASS light power A12. The second determination section 300B stores the determined second model formula of the second ASS light power in the second memory 320B.

The operation unit 330 includes a first operation section 330A and a second operation section 330B. The first operation section 330A uses the first model formula stored in the first memory 320A and the excitation light power of the first synthesized excitation light L1 to calculate the first ASS light power A11. The second operation section 330B uses the second model formula stored in the second memory 320B and the excitation light power of the second synthesized excitation light L2 to calculate the second ASS light power A12.

The comparison operation unit 340 includes a first comparison operation section 340A. The first comparison operation section 340A calculates first total ASS light power A1 by adding up the first and second ASS light powers A11 and A12 generated in the first wavelength band with the first synthesized excitation light L1 and the second synthesized excitation light L2. The first comparison operation section 340A calculates an optical power sum by adding the first total ASS light power A1 and first target signal light power T1 of a WDM signal after Raman amplification. The first comparison operation section 340A compares the optical power sum with the first optical power SA1 of the first wavelength band monitored by the first optical monitor section 210A. The first comparison operation section 340A generates control signals for the first and second generators 100 and 110 to control the excitation light power of the synthesized excitation light L1 or L2 such that the optical power sum corresponds to the first optical power SA1.

The excitation light control unit 350 includes a first excitation light control section 350A and a second excitation light control section 350B. The first excitation light control section 350A sets excitation light power for each of the excitation light sources 101A to 101$m$ in the first generator 100, based on the control signal from the first comparison operation section 340A. The second excitation light control section 350B sets excitation light power for each of the excitation light sources 111A to 111$n$ in the second generator 110, based on the control signal from the first comparison operation section 340A. The first excitation light control section 350A outputs the excitation light powers L1A to L1$m$ supplied to the transmission optical fiber 2 by the respective excitation light sources 101A to 101$m$ to the first operation section 330A. The second excitation light control section 350B outputs the excitation light powers L2A to L2$n$ supplied to the transmission optical fiber 2 by the respective excitation light sources 111A to 111$n$ to the second operation section 330B.

Next, the first determination section 300A is described in detail. The first determination section 300A uses the calculated first wavelength differences $\Delta\lambda$ (11, i) and $\Delta\lambda$ (12, i), the excitation light power of the first synthesized excitation light L1, and the measured first ASS light power A11 to determine the first model formula for calculating the first ASS light power A11.

Figure 4:
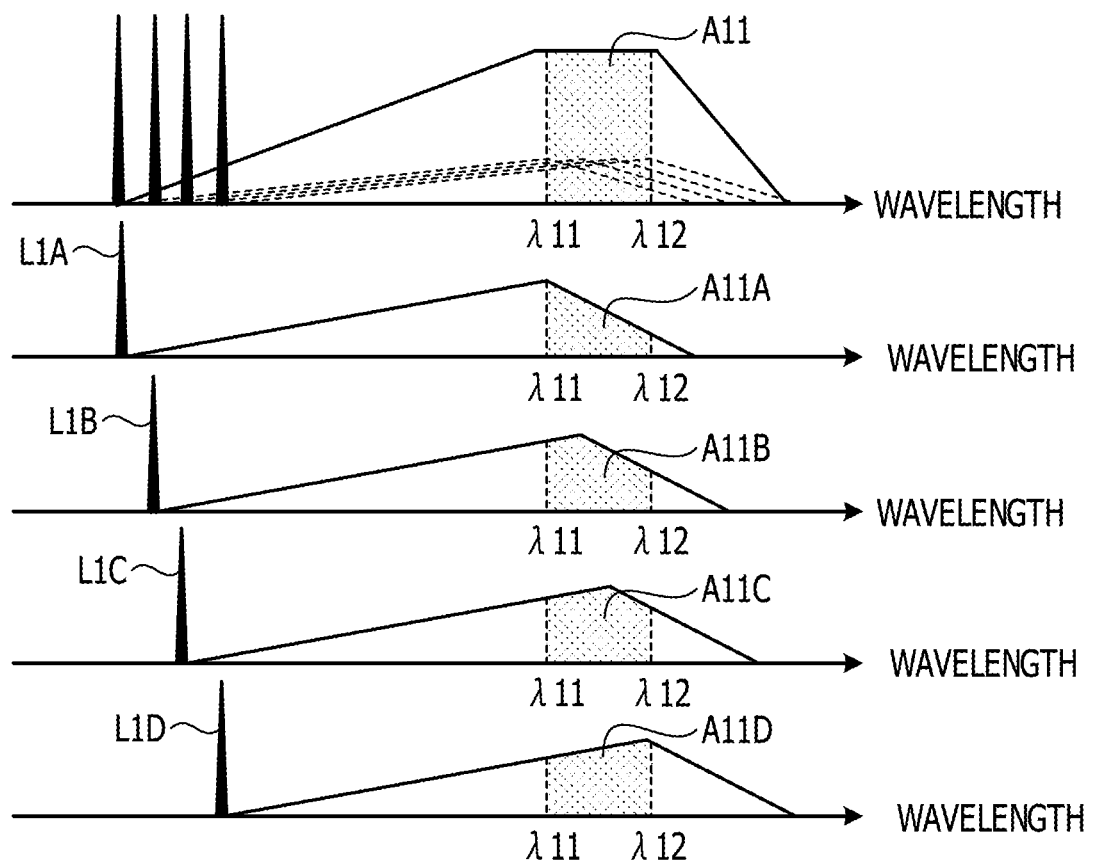
FIG. 4 is an explanatory diagram illustrating an example of wavelength characteristics of first ASS light power generated in a first wavelength band with first synthesized excitation light.

FIG. 4 is an explanatory diagram illustrating an example of wavelength characteristics of the first ASS light power A11 generated in the first wavelength band with the first synthesized excitation light L1. As illustrated in FIG. 4, the first ASS light power A11 is determined by summing up the first ASS light power A11A to A11$m$ generated with the excitation light powers L1A to L1$m$ of the first excitation light from the respective excitation light sources 101A to 101$m$.

Figure 5:
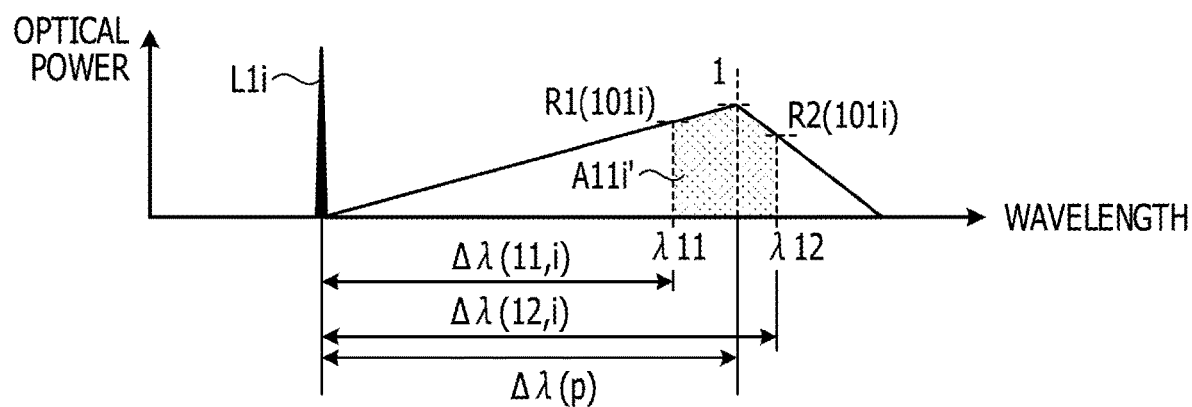
FIG. 5 is an explanatory diagram illustrating an example of a relative ratio of the wavelength characteristics of the first ASS light power generated in the first wavelength band with the first synthesized excitation light.

FIG. 5 is an explanatory diagram illustrating an example of a relative ratio of the wavelength characteristics of the first ASS light power A11 generated in the first wavelength band with the first synthesized excitation light L1. The relative ratio is an ASS light power ratio as a function of a wavelength difference from an excitation light wavelength L1$i$ when the ASS light power at the peak wavelength of the first ASS light power A11 is defined as "1" as illustrated in FIG. 5. Since a common transmission path is used as the amplification medium for optical signals of all wavelengths in Raman amplification, the wavelength characteristics of the ASS light power with respect to the excitation light wavelength are uniform regardless of the excitation light wavelength. Therefore, the wavelength characteristics of the ASS light power with respect to the excitation light wavelength are stored in the wavelength characteristic memory 321, for example, as the wavelength characteristics such as the ASS light power relative ratio as a function of the wavelength difference from the excitation light wavelength.

The first ASS light power A11$i$ of the excitation light source 101$i$ ($i$=1 to m) may be calculated using an integrated value of the first wavelength differences Δλ (11, i) and Δλ (12, i) and the excitation light power L1$i$ of the excitation light source 101$i$. The integrated value is calculated using a peak wavelength Δλp(i) ($i$=1 to m), the first wavelength differences Δλ (11, i) and Δλ (12, i), and ASS light power relative ratios R1 (101$i$) and R2 (101$i$). The peak wavelength Δλp(i) ($i$=1 to m) is the peak wavelength of the wavelength characteristics of the first ASS light power A11. The ASS light power relative ratios R1 (101$i$) and R2 (101$i$) are ASS light power relative ratios at the first wavelength differences Δλ (11, i) and Δλ (12, i). An integrated value A11$i'$ of the first ASS light power A11$i$ may be represented by Equation 1.

$$A11i' = \int_{\Delta\lambda(11,i)}^{\Delta\lambda(12,i)} A11i'(\lambda) \quad (1)$$
$$= (\Delta\lambda p(i) - \Delta\lambda 1(11, i)) \times (R1(101i) + 1)/2 +$$
$$(\Delta\lambda(12, i) - \Delta\lambda p(i)) \times (1 + R2(101i))/2$$

Equation 1 represents a model formula when the peak wavelength of the first ASS light power A11 generated by the excitation light source 101$i$ is within the first wavelength band. However, when the peak wavelength of the first ASS light power A11 is outside the first wavelength band, the integrated value A11$i'$ of the first ASS light power A11$i$ may be represented by Equation 2.

$$A11i' = \int_{\Delta\lambda(11,i)}^{\Delta\lambda(12,i)} A11i'(\lambda) \quad (2)$$
$$= (\Delta\lambda(12, i) - \Delta\lambda 1(11, i)) \times (R1(101i) + R2(101i))/2$$

The first ASS light power A11 may be represented by Equation 3 using the excitation light powers L1A to L1$m$ of the respective excitation light sources 101A to 101$m$, the integrated value A11$i'$ of the first ASS light power A11 for the respective excitation light sources 101A to 101$m$, and a generation efficiency K.

$$A11 = K \times \sum_{i=1}^{m}(L1i \times A11i') = \sum_{i=1}^{m}(K \times L1i \times A11i') = \sum_{i=1}^{m}(A11i) \quad (3)$$

The first ASS light power A11 represented by Equation 3 is the first ASS light power A11 generated in the first wavelength band with the first excitation light in the preparatory stage before the start of operation. The excitation light power L1$i$ ($i$=1 to m) in Equation 3 is excitation light power set for each of the excitation light sources 101A to 101$m$ by the first excitation light control section 350A. The integrated value A11$i'$ of the first ASS light power A11 in Equation 3 is calculated using Equations 1 and 2. Furthermore, the generation efficiency K is ASS light power generation efficiency calculated using the integrated value A11$i'$ of the first ASS light power A11 and Equation 3.

To rephrase Equation 3, the first ASS light power A11$i$ may be represented by a value obtained by multiplying the integrated value A11$i'$ of the first ASS light power A11 of each excitation light source 101$i$ ($i$=1 to m) by the excitation light power L1$i$ and the generation efficiency K, as illustrated in FIG. 5. The first ASS light power A11 may be represented by a total value of the first ASS light power A11$i$ generated in the first wavelength band with each first excitation light from each excitation light source 101$i$ ($i$=1 to m), as illustrated in FIG. 4.

In Equation 3, the first ASS light power A11$i$ generated in the first wavelength band with each first excitation light from the excitation light source 101$i$ is similar to a value obtained by multiplying the integrated value A11$i'$ of the first ASS light power A11 by the excitation light power L1$i$ of the excitation light source 101$i$. However, the approximation method is not limited to a linear function but may be changed accordingly, and another operation method may be used, for example, including a table of values of the generation efficiency K as a function of the excitation light power.

Next, the second determination section 300B is described in detail. The second determination section 300B uses the second wavelength differences Δλ (11, j) and Δλ (12, j) calculated by the second wavelength difference calculation section 310B and the excitation light power of the second synthesized excitation light L2 to determine the second model formula used to calculate the second ASS light power A12.

Since a common transmission path is used as the amplification medium for optical signals of all wavelengths, the wavelength characteristics of the ASS light power with respect to the excitation light wavelength are uniform regardless of the excitation light wavelength, as illustrated in FIGS. 4 and 5. Therefore, the second ASS light power A12 is determined by summing up the second ASS light powers A12A to A1 generated by the Raman effect resulting from the excitation light powers L2A to L2$n$ of the second excitation light from the respective excitation light sources 111A to 111$n$. The second ASS light power A12$j$ generated in the first wavelength band with the second excitation light from the excitation light source 111$j$ ($j$=1 to n) may be calculated using an integrated value of the second wavelength differences Δλ (11, j) and Δλ (12, j) and the excitation light power L2$j$ of the excitation light sources 111A to 111$n$. The integrated value is calculated using a peak wavelength Δλp(j) ($j$=1 to n), the second wavelength differences Δλ (11, j) and Δλ (12, j), and ASS light power relative ratios R1 (111$j$) and R2 (111$j$). The peak wavelength Δλp(j) ($j$=1 to n) is the peak wavelength of the ASS light power wavelength characteristics illustrated in FIG. 5. The ASS light power relative ratios R1 (111$j$) and R2 (111$j$) are ASS light power relative ratios at the second wavelength differences Δλ (11, j) and Δλ (12, j). An integrated value A12$j'$ of the second ASS light power A12$j$ may be represented by Equation 4.

$$A12j' = \int_{\Delta\lambda(11,j)}^{\Delta\lambda(12,j)} A12j'(\lambda) \qquad (4)$$
$$= (\Delta\lambda p(j) - \Delta\lambda(11, j)) \times (R1(111j) + 1)/2 +$$
$$(\Delta\lambda(12, j) - \Delta\lambda p(j)) \times (1 + R2(111j))/2$$

Equation 4 represents a model formula when the peak wavelength of the second ASS light power A12 generated by the excitation light source 111j is within the first wavelength band. However, when the peak wavelength of the second ASS light power A12 is outside the first wavelength band, the integrated value A12j' of the second ASS light power A12j may be represented by Equation 5.

$$A12j' = \int_{\Delta\lambda(11,j)}^{\Delta\lambda(12,j)} A12j'(\lambda) \qquad (5)$$
$$= (\Delta\lambda(12, j) - \Delta\lambda(11, j)) \times (R1(111j) + R2(111j))/2$$

Since the common transmission optical fiber 2 is used as the amplification medium for optical signals of all wavelengths in an optical transmission system, the generation efficiency K achieved by supplying the excitation light power to the transmission optical fiber 2 takes a uniform value regardless of the excitation light wavelength. Therefore, the second ASS light power A12 may be represented by Equation 6 using the generation efficiency K, the excitation light power L2A to L2n supplied to the transmission optical fiber 2 by the respective excitation light sources 111A to 111n, and the integrated value A12j' of the second ASS light power A12.

$$A12 = K \times \sum_{j=1}^{n} (L2j \times A12j') = \sum_{j=1}^{n} (K \times L2j \times A12j') = \sum_{j=1}^{n} (A12j) \qquad (6)$$

To rephrase Equation 6, the second ASS light power A12j may be represented by a value obtained by multiplying the integrated value A12j' of the second ASS light power A12 of each excitation light source 111j (j=1 to n) by the excitation light power L2j and the generation efficiency K. The second ASS light power A12 may be represented by a total value of the second ASS light power A12j generated in the first wavelength band with each second excitation light from each excitation light source 111j (j=1 to n).

The first operation section 330A uses the first model formula stored in the first memory 320A and the excitation light powers L1A to L1m set by the first excitation light control section 350A to calculate the first ASS light power A11. The second operation section 330B uses the second model formula stored in the second memory 320B and the excitation light powers L2A to L2n set by the second excitation light control section 350B to calculate the second ASS light power A12.

Figure 6:
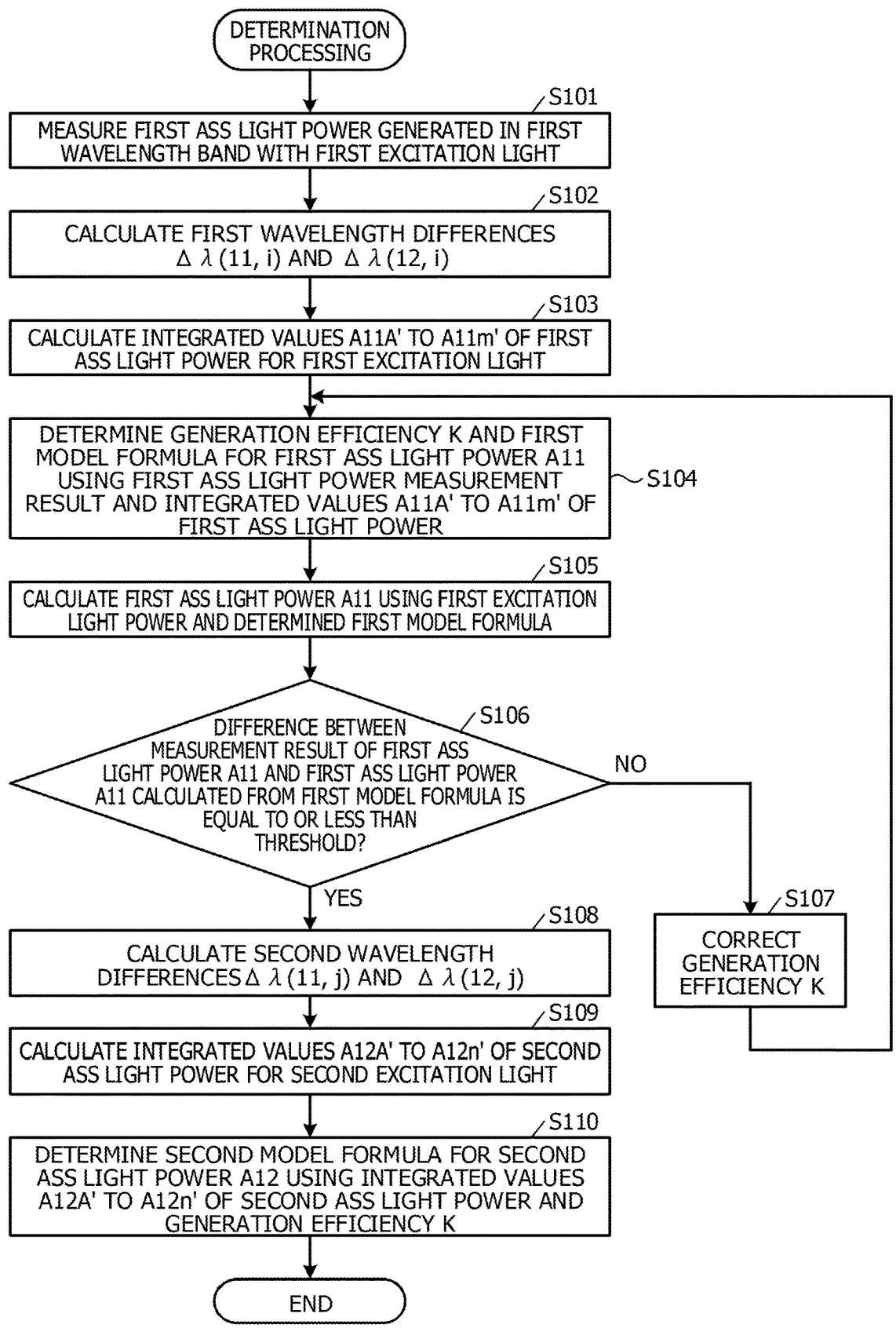
FIG. 6 is a flowchart illustrating an example of processing operations by a controller, regarding determination processing.

FIG. 6 is a flowchart illustrating an example of processing operations by the controller 30, regarding determination processing. The determination processing illustrated in FIG. 6 is processing in the preparatory stage before the start of operation for the first wavelength band to be introduced after building of an optical transmission system.

In FIG. 6, the first determination section 300A in the controller 30 measures, through the first optical monitor section 210A, first ASS light power A11 of the first wavelength band, which is generated by supplying first excitation light to the transmission optical fiber 2 from each of the excitation light sources 101A to 101m (Step S101). The first determination section 300A changes the excitation light powers L1A to L1m of the excitation light sources 101A to 101m, for example, in a stepwise fashion such as 40 mW, 60 mW, 80 mW, 100 mW, 120 mW, and 140 mW. Then, the first optical monitor section 210A propagates the first ASS light power A11 changing for each excitation light power in a direction opposite to the excitation light supplied to the transmission optical fiber 2, measures the first ASS light power A11 generated in the first wavelength band, and notifies the first determination section 300A of the measurement result. Thereafter, the first determination section 300A stores the measurement result of the first ASS light power A11 measured by the first optical monitor section 210A in the first memory 320A for each excitation light power supply condition.

The first wavelength difference calculation section 310A calculates the first wavelength differences $\Delta\lambda$ (11, i) and $\Delta\lambda$(12, i) between each of the end-to-end wavelengths $\lambda$11 and $\lambda$12 of the first wavelength band and the first excitation light wavelength of the excitation light sources 101A to 101m (Step S102). The end-to-end wavelengths $\lambda$11 and $\lambda$12 of the first wavelength band used in the early stage of the optical transmission system and the first excitation light wavelength of the excitation light sources 101A to 101m used for Raman amplification of the WDM signal light of the first wavelength band are previously set before the start of operation of the system.

The first determination section 300A uses the first wavelength differences $\Delta\lambda$ (11, i) and $\Delta\lambda$ (12, i) and the stored ASS light power wavelength characteristics to calculate integrated values A11A' to A11m' of the first ASS light power generated in the first wavelength band with the respective first excitation light (Step S103). The ASS light power wavelength characteristics are the relative ratio of the ASS light power to the excitation light wavelength. The integrated values A11A' to A11m' of the first ASS light power A11 are calculated, for example, using Equation 1 or Equation 2. The first determination section 300A stores the calculated integrated values A11A' to A11m' of the first ASS light power A11, for each of the excitation light sources 101.

The first determination section 300A uses the measurement result of the first ASS light power A11 and the integrated values A11A' to A11m' calculated in Step S103 to determine a model formula for the generation efficiency K and the first ASS light power A11 (Step S104). The first determination section 300A stores the first model formula determined for the generation efficiency K and the first ASS light power A11, as a parameter of the model formula of Equation 3, for example, in the first memory 320A.

With reference to FIG. 7A, description is given of an example of the integrated values A11A' to A11m' of the first ASS light power A11 calculated in Step S103 and the generation efficiency K determined in Step S104. FIG. 7A is an explanatory diagram illustrating an example of wavelength characteristics of the first excitation light from the first generator 100. For convenience of explanation, FIG. 7A illustrates an example of wavelength characteristics of four excitation light sources 101A to 101D in the first generator 100.

As for the wavelength characteristics illustrated in FIG. 7A, identification information of the excitation light sources 101, wavelengths of the first excitation light for the respective excitation light sources 101, and the first wavelength differences $\Delta\lambda$ (11, i) and $\Delta\lambda$ (12, i) are stored in association with each other. As for the wavelength characteristics, the ASS light power relative ratios R1 (101$i$) and R2 (101$i$) and the integrated values A11A' to A11$m$' are further stored for each piece of the identification information of the excitation light sources 101. The ASS light power relative ratios R1 (101$i$) and R2 (101$i$) are stored in the first memory 320A. As for the ASS light power relative ratio, the peak is defined as "1" and the wavelength difference from the excitation light wavelength at the peak wavelength is defined as 100 nm, as illustrated in FIG. 5.

FIG. 7B is an explanatory diagram illustrating an example of wavelength characteristics of the second excitation light from the second generator 110. For convenience of explanation, FIG. 7B illustrates an example of wavelength characteristics of three excitation light sources 111A to 111C in the second generator 110. As for the wavelength characteristics illustrated in FIG. 7B, identification information of the respective excitation light sources 111, wavelengths of the second excitation light for the respective excitation light sources 111, and the second wavelength differences Δλ (11, j) and Δλ (12, j) are stored in association with each other. As for the wavelength characteristics, the ASS light power relative ratios R1 (111$j$) and R2 (111$j$) and the integrated values A12A' to A1' are stored for each piece of the identification information of the excitation light sources. The ASS light power relative ratios R1 (111$j$) and R2 (111$j$) are stored in the second memory 320B.

It is assumed that the excitation light powers L1A to L1D of the first excitation light from the excitation light sources 101A to 101D measured in Step S101 are all 100 mW and the first ASS light power A11 generated in the first wavelength band is −25 dBm. In this case, the generation efficiency K of the transmission optical fiber 2 may be calculated as $2.51 \times 10^{-6}$ mW/mW, using Equations 1 to 3.

The first operation section 330A uses the first model formula determined in Step S104 and the excitation light powers L1A to L1$m$ of the first excitation light to calculate the first ASS light power A11 generated in the first wavelength band with the first synthesized excitation light power L1 (Step S105).

The first operation section 330A calculates a difference between the first ASS light power A11 calculated in Step S105 and the measurement result of the actual first ASS light power A11 stored in the first memory 320A. The first operation section 330A determines whether or not the difference between the calculated first ASS light power A11 and the measurement result of the actual first ASS light power is not more than a previously set threshold (for example, 0.5 dB) (Step S106). When the difference is not equal to or less than the set threshold (No in Step S106), the first operation section 330A corrects the value of the generation efficiency K according to the excitation light power (Step S107) and moves again to Step S104 to determine the first model formula. Then, the processing moves to Step S107 to correct the generation efficiency K until the difference between the first ASS light power A11 calculated with the first model formula and the actual first ASS light power of the measurement result becomes equal to or less than the threshold.

When the difference is equal to or less than the set threshold (Yes in Step S106), the second wavelength difference calculation section 310B calculates second wavelength differences Δλ (11, j) and Δλ (12, j) (Step S108). The second wavelength difference calculation section 310B calculates the second wavelength differences Δλ (11, j) and Δλ (12, j) between each of the end-to-end wavelengths λ11 and λ12 of the first wavelength band and the second excitation light wavelength of the excitation light sources 111A to 111$n$. The end-to-end wavelengths λ11 and λ12 of the first wavelength band used in the early stage and the excitation light wavelength of the excitation light sources 111A to 111$n$ to be added for addition of the operation band are previously set before addition of the second generator 110.

The second determination section 300B uses the calculated second wavelength differences Δλ (11, j) and Δλ (12, j) and the stored wavelength characteristics to calculate integrated values A12A' to A1' of the second ASS light power A12$j$ generated in the first wavelength band with the second excitation light (Step S109). The ASS light power wavelength characteristics are the relative ratio of the ASS light power to the excitation light wavelength. The integrated values A12A' to A1' of the second ASS light power A12$j$ are calculated, for example, using Equation 4 or Equation 5. The second determination section 300B stores the calculated integrated values A12A' to A12-$n$' of the second ASS light power A12$j$, for each of the excitation light sources 111.

The second determination section 300B uses the generation efficiency K stored in the first memory 320A and the integrated values A12A' to A12-$n$' of the second ASS light power A12$j$ to determine a second model formula for the second ASS light power A12 (Step S110). The second determination section 300B stores the determined second model formula (Equation 6) for the second ASS light power A12 in the second memory 320B.

When the excitation light powers L2A to L2C supplied to the transmission optical fiber 2 by the respective excitation light sources 111A to 111C are all 100 mW, the generation efficiency K of the transmission optical fiber 2 determined in Step S104 is $2.51 \times 10^{-6}$ mW/mW. Therefore, the second determination section 300B may calculate the second ASS light power A12 as −27.3 dBm using Equations 4 to 6.

Figure 8:
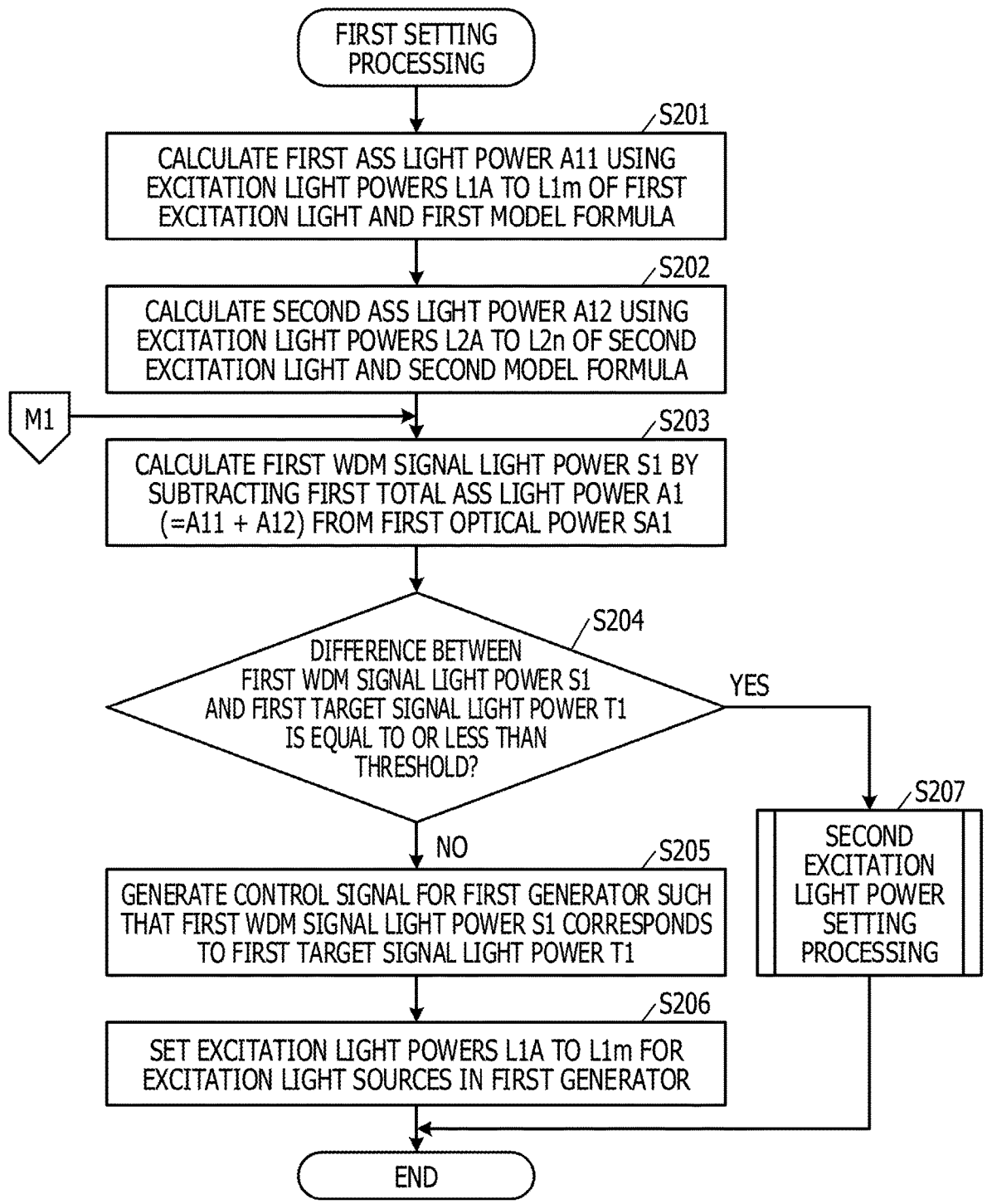
FIG. 8 is a flowchart illustrating an example of processing operations by the controller, regarding first setting processing.

The determination unit 300 determines the first model formula for the first ASS light power A11 and the second model formula for the second ASS light power A12. Next, description is given of operations of the Raman optical amplifier 1 at the execution stage of an actual operation. FIG. 8 is a flowchart illustrating an example of processing operations by the controller 30, regarding first setting processing. The first setting processing illustrated in FIG. 8 is processing of calculating first WDM signal light power S1 based on first and second ASS light powers A11 and A12 to be calculated at the operation execution stage and the first light power SA1 of the first wavelength band as the monitor result. Furthermore, the first setting processing is processing of controlling the excitation light power such that the calculated first WDM signal light power S1 corresponds to the first target signal light power T1 after Raman amplification.

In FIG. 8, the first operation section 330A in the controller 30 uses the stored first model formula and the excitation light powers L1A to L1$m$ of the first excitation light set by the first excitation light control section 350A to calculate the first ASS light power A11 (Step S201). The second operation section 330B uses the stored second model formula and the excitation light powers L2A to L2$n$ of the second excitation light set by the second excitation light control section 350B to calculate the second ASS light power A12 (Step S202). The first comparison operation section 340A calculates the first total ASS light power A1 by adding up the calculated first and second ASS light powers A11 and A12. The first comparison operation section 340A also calculates the first WDM signal light power S1 of the first wavelength band by subtracting the first total ASS light power A1 from the first optical power SA1 of the first wavelength band monitored by the first optical monitor section 210A (Step S203). The first WDM signal light power S1 may be represented by Equation 7.

$$S1=SA1-A1=SA1-(A11+A12) \qquad (7)$$

In Step S203, in the early stage of operation where only the first wavelength band is used in the optical transmission system, that is, when no second generator 110 is added, no second ASS light power A12 is generated in the first wavelength band, thus resulting in A12=0 mW.

The first comparison operation section 340A calculates a difference between the calculated first WDM signal light power S1 and the first target signal light power T1 of the Raman-amplified WDM signal light. The first comparison operation section 340A determines whether or not the difference between the calculated first WDM signal light power S1 and the first target signal light power T1 is not more than a previously set threshold (for example, 0.5 dB) (Step S204). When the difference is not equal to or less than the threshold (No in Step S204), the first excitation light control section 350A generates a control signal for the first generator 100 (Step S205). The first excitation light control section 350A generates the control signal for the first generator 100 to control the first synthesized excitation light power L1 such that the first WDM signal light power S1 corresponds to the first target signal light power T1. The first excitation light control section 350A sets the excitation light power for each of the excitation light sources 101A to 101m based on the control signal from the first comparison operation section 340A (Step S206), and then terminates the processing illustrated in FIG. 8.

When the difference is equal to or less than the set threshold (Yes in Step S204), the second excitation light control section 350B terminates the control of the first synthesized excitation light power L1, since the first WDM signal light power S1 corresponds to the first target signal light power T1. Then, the second excitation light control section 350B executes second excitation light power setting processing to set the excitation light power for each of the excitation light sources 111A to 111n (Step S207), and then terminates the processing operations illustrated in FIG. 8.

Figure 9A:
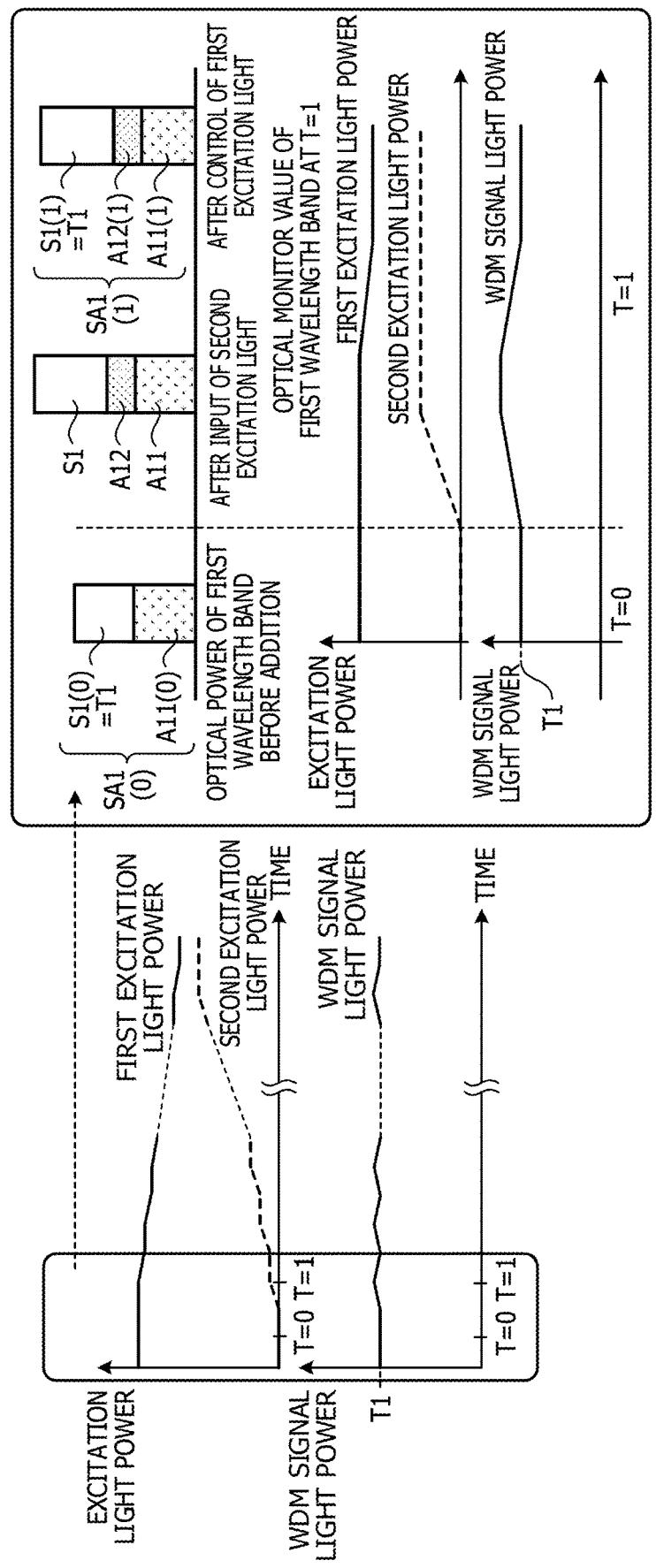
FIG. 9A is an explanatory diagram illustrating an example of an optical power control process for the Raman optical amplifier according to Embodiment 1.

The controller 30 controls the first WDM signal light power S1 to be the first target signal light power T1 for achieving transmission performance desired for the optical transmission system. FIG. 9A is an explanatory diagram illustrating an example of an optical power control process for the Raman optical amplifier 1 according to Embodiment 1. Assuming that the time before addition of the excitation light power of the second excitation light is T=0, the first WDM signal light power S1(0) of the first wavelength band is controlled to be the first target signal light power T1. At the time T=0, which is before the supply of the second excitation light, the excitation light power of the second excitation light is 0 mW. In this event, the first optical power SA1(0) of the first wavelength band may be represented by Equation 8.

$$SA1(0)=A11(0)+S1(0)=A11(0)+T1 \qquad (8)$$

At the time T=1, once the second excitation light is supplied to the transmission optical fiber 2, the processing of Steps S201 to S206 is executed. The first optical power SA1(1) of the first wavelength band after completion of the setting of the excitation light power of the first excitation light and the calculation of the first and second ASS light powers A11 and A12 may be represented by Equation 9.

$$SA1(1)=A11(1)+S1(1)=A12(1)=A11(1)+T1+A12(1) \qquad (9)$$

The controller 30 repeats the processing using Equations 8 and 9 until the second synthesized excitation light power L2 becomes a predetermined value. A series of processing at the time T=k may be represented by Equation 10.

$$SA1(k)=A11(k)+S1(k)=A12(k)=A11(k)+T1+A12(k) \qquad (10)$$

The control process in the chronological order illustrated in FIG. 9A suppresses the difference between the first WDM signal light power S1(t) of the first wavelength band and the first target signal light power T1 by gradually increasing the second synthesized excitation light power L2 for a series of processing from Step S201 to Step S207 illustrated in FIG. 8. More specifically, stable transmission performance may be ensured even if the second synthesized excitation light power L2 is added.

Figure 9B:
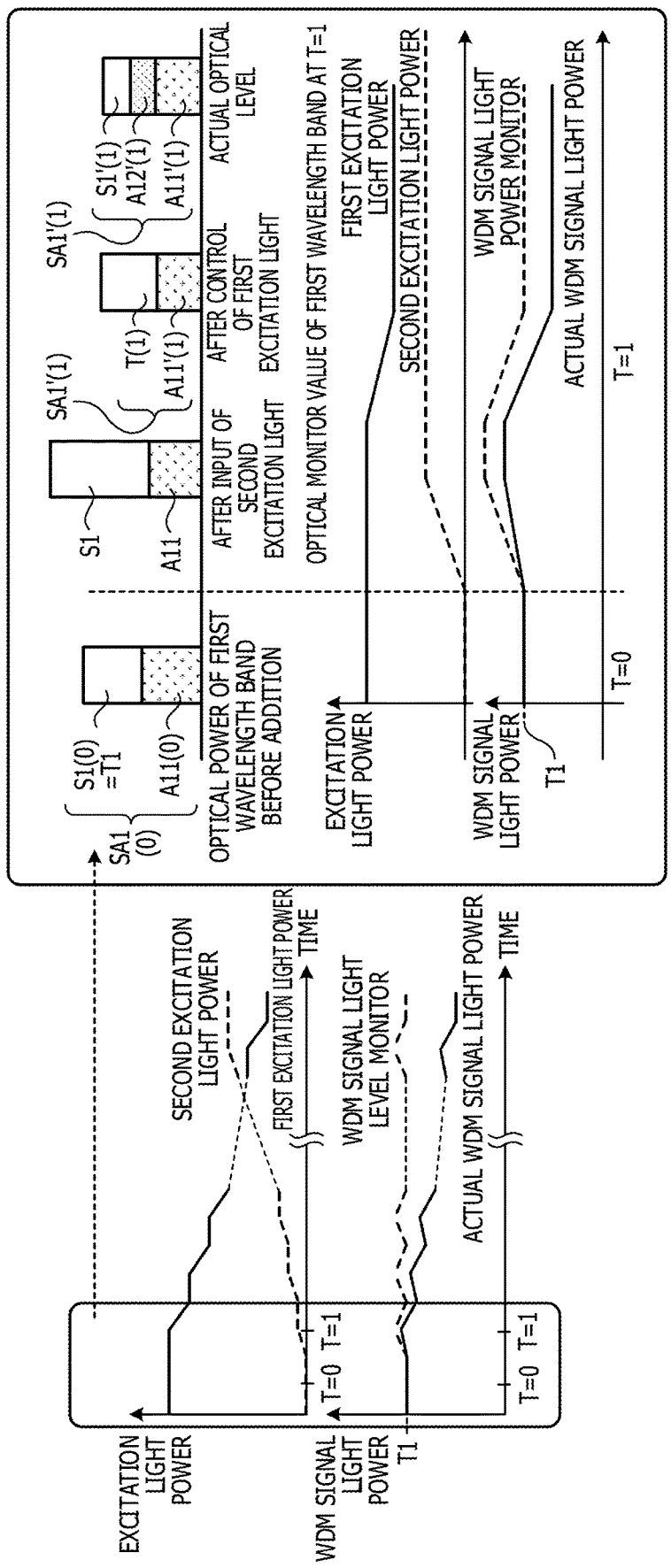
FIG. 9B is an explanatory diagram illustrating an example of an optical power control process for a conventional Raman optical amplifier.

FIG. 9B is an explanatory diagram illustrating an example of an optical power control process for a conventional Raman optical amplifier. Each optical power at the time T=0 before addition of the second excitation light is the same as that of FIG. 9A. At the time T=1, as the second excitation light is supplied to the transmission optical fiber 2, the conventional method has no calculation process for the second ASS light power A12'(1) generated in the first wavelength band with the second excitation light. Therefore, the calculation of the WDM signal light power is determined by the difference between the first optical power SA1'(1) of the first wavelength band and the first ASS light power A11'(1) generated in the first wavelength band with the first excitation light. However, at the time T=1, the second ASS light power A12'(1) is generated with the second excitation light. As a result, the actual WDM signal light power is signal light power S1'(1) smaller than the first target signal light power T1, as illustrated in the right part of FIG. 9B, causing an error between the actual WDM signal light power and the first target signal light power. Due to this error, the WDM signal light power may not be controlled to a target value. Therefore, stable transmission performance may not be ensured when the band is added.

With the Raman optical amplifier 1 according to Embodiment 1, an increase in ass light power generated in the existing band (first wavelength band) by addition of the second excitation light is calculated with high accuracy using the measurement result on the existing band for the initial building. The Raman optical amplifier 1 further monitors the first WDM signal light power of the existing band to control the first WDM signal light power to be the first target signal light power. As a result, the wavelength band may be added while ensuring the stable transmission performance for the WDM signal. The Raman optical amplifier 1 may control the excitation light power of the excitation light source while taking into consideration the influence of the ASS light generated by addition of the excitation light for not only the existing band but also the added band.

The controller 30 calculates the first ASS light power A11 which corresponds to the first excitation light power and is generated in the first wavelength band with the first excitation light, and also calculates the second ASS light power A12 which corresponds to the second excitation light power and is generated in the first wavelength band with the second excitation light. The controller 30 calculates the first WDM signal light power S1 by subtracting the calculated first and second ASS light powers A11 and A12 from the first optical power SA1 measured by the first optical monitor section 210A. The controller 30 further controls the first and second generators 100 and 110 to adjust the first or second excitation light, based on a difference between the first WDM signal light power S1 and the first target signal light power T1. As a result, the first WDM signal light power S1 may be calculated with high accuracy by calculating, with high accuracy, the second ASS light power A12 generated in the first wavelength band even in the case of expanding different wavelength bands. Thus, stable transmission performance may be ensured.

The controller 30 determines the first model formula for use in calculation of the first ASS light power A11, based on the integrated value of the first ASS light power A11 corresponding to the first wavelength difference. The controller 30 further determines the second model formula for use in calculation of the second ASS light power A12, based on the integrated value of the second ASS light power A12 corresponding to the second wavelength difference. As a result, the first and second ASS light powers A11 and A12 may be calculated with high accuracy using the first and second model formulas.

The controller 30 manages the first model formula associating the first excitation light power with the first ASS light power A11, according to the characteristics of the optical fiber type that is the amplification medium. Then, the controller 30 corrects the generation efficiency K for the first model formula, based on the first excitation light power and the first ASS light power A11 measured in the preparatory stage before the start of operation for the first wavelength band. As a result, the highly accurate first model formula may be acquired for use in calculation of the first ASS light power A11.

In the wavelength characteristic memory 321, the controller 30 stores the first excitation light wavelength, the second excitation light wavelength, and the ASS light power wavelength characteristics in association with each other according to the type of the optical fiber that serves as the amplification medium. As a result, the ASS light power wavelength characteristics may be identified according to the type of the optical fiber as the amplification medium.

The Raman optical amplifier 1 may accurately calculate the second ASS light power A12 generated by the addition of the second excitation light. Thus, an optical transmission device on the downstream side may realize WDM signal light power control for realizing a desired OSNR using the ASS light power generated by Raman amplification.

The first comparison operation section 340A executes the processing of Steps S203 to S205 illustrated in FIG. 8. However, the first comparison operation section 340A may execute the following processing instead of the processing of Steps S203 to S205. The first comparison operation section 340A calculates a first total ASS light power A1(=A11+A12) by adding up first and second ASS light powers A11 and A12 to be calculated. The first comparison operation section 340A also calculates a first optical power sum that is the sum of the calculated first total ASS light power A1 and first target signal light power T1 of WDM signal light after Raman amplification. The first comparison operation section 340A compares the first optical power sum with the first optical power SA1 of the first wavelength band monitored by the first optical monitor section 210A. The first comparison operation section 340A determines whether or not a difference between the first optical power sum and the first optical power SA1 is not more than a previously set threshold (for example, 0.5 dB). When the difference is not equal to or less than the set threshold, the first comparison operation section 340A may move to Step S206 to set the excitation light power of the first excitation light. The first comparison operation section 340A may represent the first optical power SA1 by Equation 11.

$$SA1 = T1 + A1 = T1 + (A11 + A12) \tag{11}$$

The determination unit 300 in Embodiment 1 determines the model formula for the ASS light power, but the embodiments are not limited to the model formula. For example, the determination unit 300 may be accordingly modified to determine a correlation table for the ASS light power.

Embodiment 2

Figure 10:
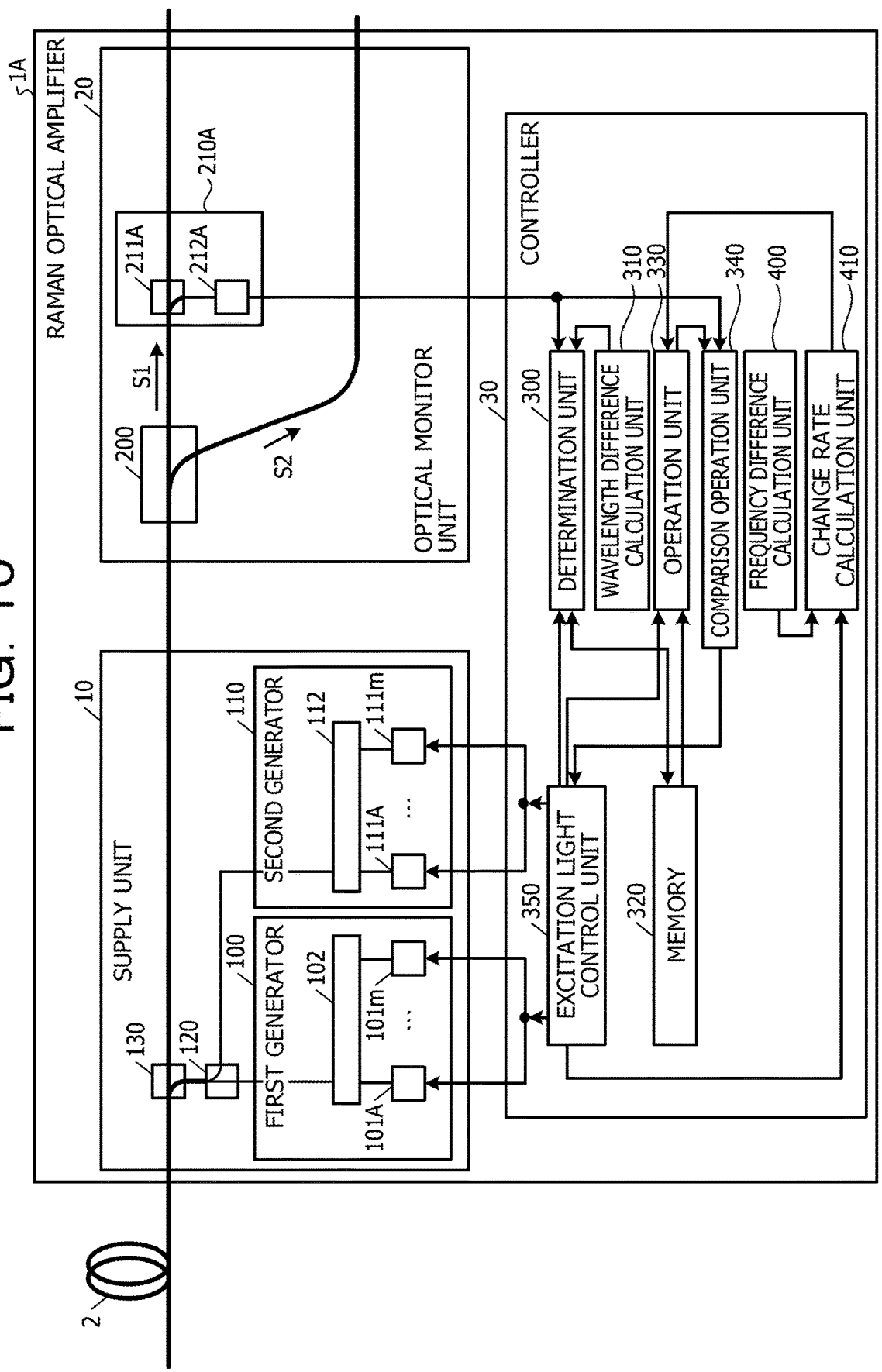
FIG. 10 is an explanatory diagram illustrating an example of a Raman optical amplifier according to Embodiment 2.

A Raman optical amplifier 1A according to Embodiment 2 is described. FIG. 10 is an explanatory diagram illustrating an example of the Raman optical amplifier 1A according to Embodiment 2. The same constituent components as those in the Raman optical amplifier 1 according to Embodiment 1 are denoted by the same reference numerals, and repetitive description of the configuration and operations thereof is omitted. A controller 30 in the Raman optical amplifier 1A illustrated in FIG. 10 includes a frequency difference calculation unit 400 and a change rate calculation unit 410, in addition to a determination unit 300, a wavelength difference calculation unit 310, a memory 320, an operation unit 330, a comparison operation unit 340, and an excitation light control unit 350. The frequency difference calculation unit 400 calculates a frequency difference between first excitation light and second excitation light, for each first excitation light. From the frequency difference calculated by the frequency difference calculation unit 400, the change rate calculation unit 410 calculates a change rate in excitation light power resulting from a Raman effect generated between the excitation lights in the transmission optical fiber 2.

Figure 11:
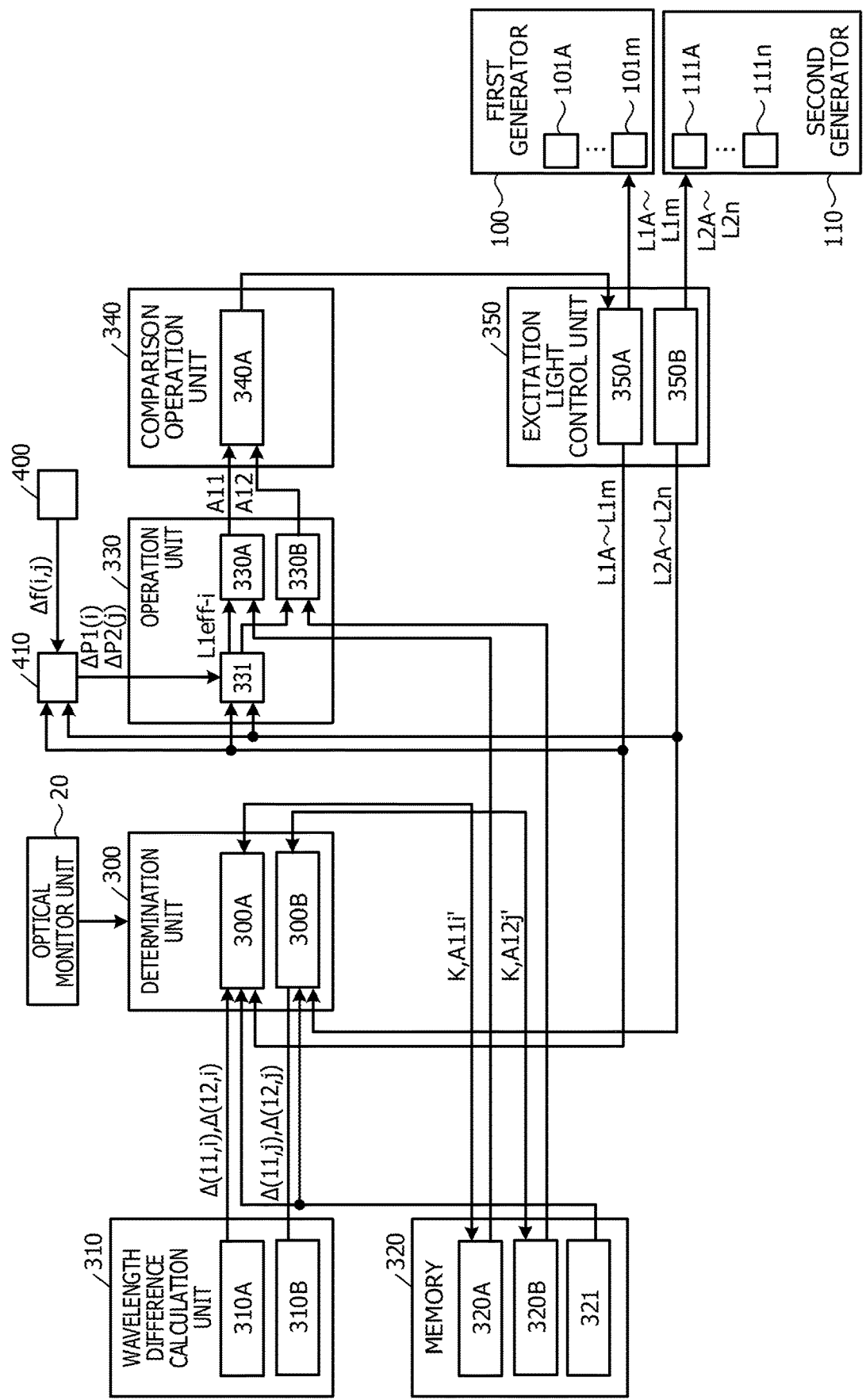
FIG. 11 is an explanatory diagram illustrating an example of a functional configuration of a controller according to Embodiment 2.

FIG. 11 is an explanatory diagram illustrating an example of a functional configuration of the controller 30 according to Embodiment 2. The operation unit 330 in the controller 30 illustrated in FIG. 11 includes an effective excitation light power calculation section 331, in addition to first and second operation sections 330A and 330B. The frequency difference calculation unit 400 calculates a frequency difference $\Delta f(i, j)$ between the first excitation light from the respective excitation light sources 101A to 101m and the second excitation light from the respective excitation light sources 111a to 111n. The frequency difference calculation unit 400 compares frequencies f1A to f1m of the first excitation light from the excitation light sources 101A to 101m of the existing first wavelength band with frequencies f2A to f2n of the second excitation light from the excitation light sources 111A to 111n of the added second wavelength band. The frequency difference calculation unit 400 uses the frequencies f1A to f1m of the existing first excitation light and the frequencies f2A to f2n of the added second excitation light to previously calculate a frequency difference $\Delta f(i, j) = (f2j) - (f1i)$ (i=1 to m, j=1 to n) before addition of the second generator 110.

The change rate calculation unit 410 uses the frequency difference $\Delta f(i, j)$, the excitation light powers L1A to L1m of the first excitation light, and the excitation light powers L2A to L2n of the second excitation light to calculate a change rate in excitation light power resulting from the Raman effect. The change rate calculation unit 410 calculates a first excitation light power change rate $\Delta P1(i)$ (i=1 to m) in each excitation light source 101i (i=1 to m) resulting from the Raman effect received by the second generator 110. The change rate calculation unit 410 further calculates a second excitation light power change rate $\Delta P2(j)$ (j=1 to n) in each excitation light source 111j (j=1 to n) resulting from the Raman effect received by the first generator 100.

The change rate calculation unit 410 calculates the first excitation light power change rate $\Delta P1(i, j)$ (i=1 to m, j=1 to n) in the excitation light source 101i resulting from the Raman effect generated by the second excitation light from the excitation light source 111j. The first excitation light power change rate $\Delta P1(i, j)$ may be represented by Equation 12, assuming that an excitation light power change coefficient resulting from the Raman effect between the excitation lights is B.

$$\Delta P1(i,j) = B \times L2j \times \Delta f(i,j) = B \times L2j \times \{(f2j)-(f1i)\} \quad (12)$$

The change rate calculation unit 410 calculates a second excitation light power change rate $\Delta P2(j, i)$ (j=1 to n, i=1 to m) in the excitation light source 111j resulting from the Raman effect generated by the first excitation light from the excitation light source 101i. The second excitation light power change rate $\Delta P2(j, i)$ may be represented by Equation 13.

$$\Delta P2(j,i) = B \times L1i \times (-\Delta f(i,j)) = B \times L1-i \times \{(f1i)-(f2j)\} \quad (13)$$

The first excitation light power change rate $\Delta P1(i)$ (i=1 to m) is the sum of the first excitation light power change rates $\Delta P1(i, j)$ calculated using Equation 12 for the respective excitation light sources 111A to 111n, and may be represented by Equation 14.

$$\Delta P1(i) = \sum_{j=1}^{n} \Delta P1(i, j) = B \times \sum_{j=1}^{n} (L2j \times \{(f2j)-(f1i)\}) \quad (14)$$

The second excitation light power change rate $\Delta P2(j)$ (j=1 to n) in the excitation light source 111j (j=1 to n) resulting from the Raman effect generated by the first excitation light is the sum of the second excitation light power change rates $\Delta P2(j, i)$ calculated using Equation 13, and may be represented by Equation 15.

$$\Delta P2(j) = \sum_{i=1}^{m} \Delta P2(j, i) = B \times \sum_{i=1}^{m} (L1i \times \{(f1i)-(f2j)\}) \quad (15)$$

The effective excitation light power calculation section 331 uses the first excitation light power change rate $\Delta P1(i)$ (i=1 to m), the second excitation light power change rate $\Delta P2(j)$ (j=1 to n), the excitation light powers L1A to L1m, and the excitation light powers L2A to L2n to calculate effective excitation light power. The effective excitation light power is effective excitation power to generate ASS light in the first wavelength band. The first excitation light power change rate $\Delta P1(i)$ (i=1 to m) and the second excitation light power change rate $\Delta P2(j)$ (j=1 to n) may be calculated using Equations 14 and 15.

Effective excitation light power $L1\mathit{eff}\text{-}i$ (i=1 to m) after the excitation light power change in each excitation light source 101i (i=1 to m) resulting from the Raman effect of the second excitation light is calculated using excitation light power L1i and the calculated first excitation light power change rate $\Delta P1(i)$ (i=1 to m). The excitation light power L1i is excitation light power supplied to the transmission optical fiber 2 by the excitation light source 101i. The effective excitation light power $L1\mathit{eff}\text{-}i$ (i=1 to m) may be represented by Equation 16.

$$L1\mathit{eff}\text{-}i = L1i \times (1+\Delta P1(i)) \quad (16)$$

Effective excitation light power $L2\mathit{eff}\text{-}j$ (j=1 to n) after the excitation light power change in the excitation light source 111j resulting from the Raman effect of the first excitation light is calculated using excitation light power L2j and the calculated second excitation light power change rate $\Delta P2(j)$ (j=1 to n). The excitation light power L2j is excitation light power supplied to the transmission optical fiber 2 by the excitation light source 111j. The effective excitation light power $L2\mathit{eff}\text{-}j$ (j=1 to n) may be represented by Equation 17.

$$L2\mathit{eff}\text{-}j = L2j \times (1+\Delta P2(j)) \quad (17)$$

The effective excitation light powers $L1\mathit{eff}\text{-}i$ (i=1 to m) and $L2\mathit{eff}\text{-}j$ (j=1 to n) of the respective excitation light sources 101 and 111 determined using Equations 16 and 17 are outputted to the first and second operation section 330A and 330B. Then, the first operation section 330A calculates first ASS light power A11 to be generated in the first wavelength band, based on the effective excitation light power $L1\mathit{eff}\text{-}i$ (i=1 to m). Furthermore, the second operation section 330B calculates second ASS light power A12 to be generated in the first wavelength band, based on the effective excitation light power $L2\mathit{eff}\text{-}j$ (j=1 to n).

As for the excitation light power change coefficient B used for the Raman optical amplifier 1A, different values may be set according to the type of the transmission optical fiber for application of Raman amplification, such as a single mode fiber (SMF), a dispersion-shifted fiber (DSF), and a nonzero dispersion-shifted fiber (NZ-DSF). In this case, the excitation light power change coefficient B for each fiber type is stored, for example, in the memory 320, and the value corresponding to the type of the transmission optical fiber 2 for application of Raman amplification is applied to the change rate calculation unit 410.

The Raman optical amplifier 1A according to Embodiment 2 calculates the ASS light power based on the effective excitation light power for Raman amplification upon receipt of the Raman effect between the excitation lights, and thus may more accurately monitor the WDM signal light power compared with the Raman optical amplifier 1 according to Embodiment 1.

The controller 30 calculates the frequency difference Δf (i, j) between the first excitation light and the second excitation light. The controller 30 calculates the first excitation light power change rate and the second excitation light power change rate based on the frequency difference, the excitation light power change coefficient B, the excitation light power of the first excitation light, and the excitation light power of the second excitation light. The controller 30 calculates the first ASS light power A11 corresponding to the first excitation light power based on the first excitation light power change rate, and also calculates the second ASS light power A12 corresponding to the second excitation light power based on the second excitation light power change rate. As a result, stable transmission performance may be ensured by accurately calculating the first ASS light power A11 and the second ASS light power A12 even when a different wavelength band is added.

The controller 30 stores the excitation light power change coefficient B according to the type of the optical fiber that serves as the amplification medium. As a result, the first and second excitation light power change rates may be accurately calculated according to the type of the transmission optical fiber 2, by using the excitation light power change coefficient B corresponding to the type of the optical fiber that serves as the amplification medium.

Embodiment 3

Figure 12:
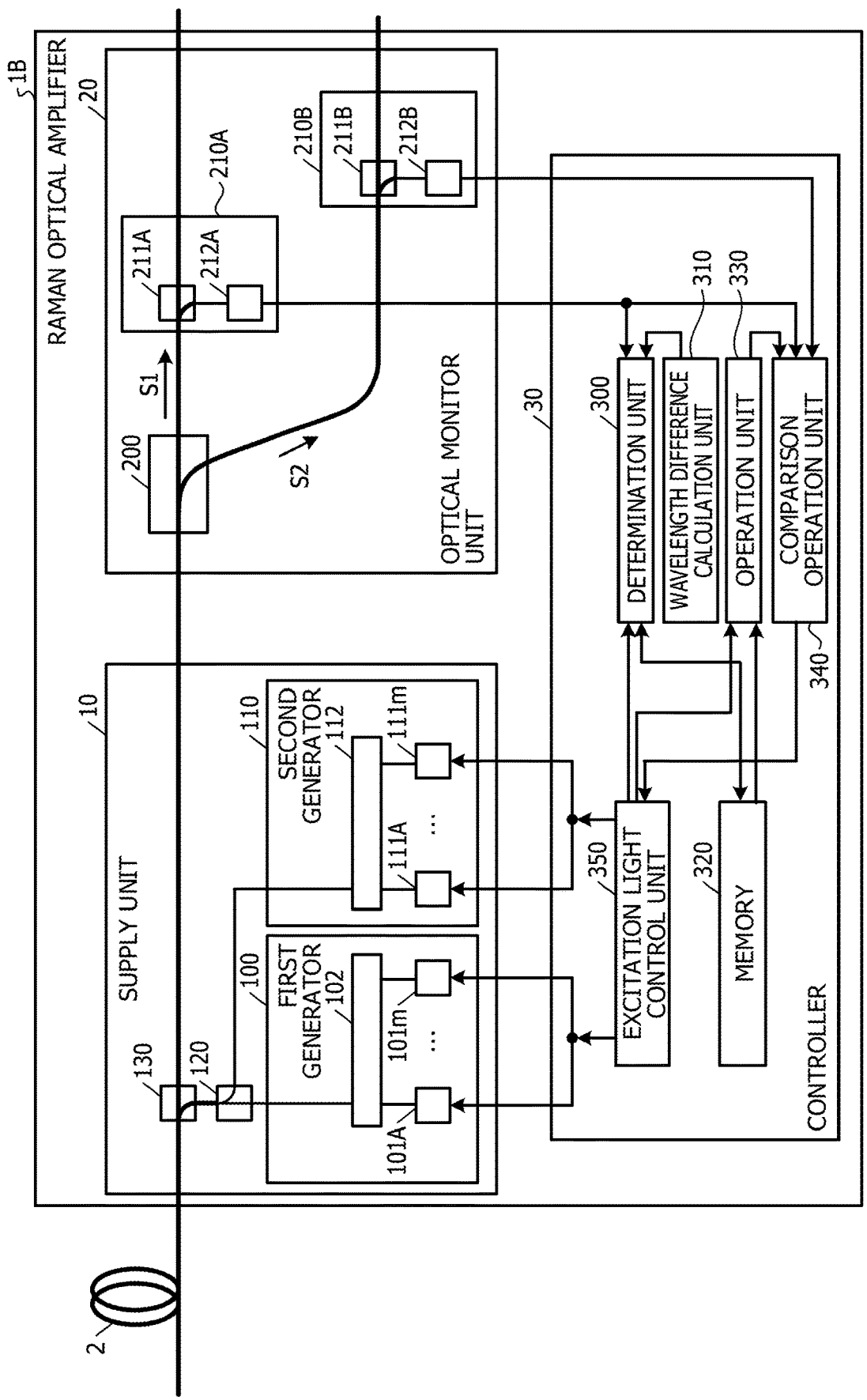
FIG. 12 is an explanatory diagram illustrating an example of a Raman optical amplifier according to Embodiment 3.

FIG. 12 is an explanatory diagram illustrating an example of a Raman optical amplifier 1B according to Embodiment 3. The same constituent components as those in the Raman optical amplifier 1 according to Embodiment 1 are denoted by the same reference numerals, and repetitive description of the configuration and operations thereof is omitted. An optical monitor unit 20 in the Raman optical amplifier 1B illustrated in FIG. 12 includes a second optical monitor section 210B, in addition to a WDM filter 200 and a first optical monitor section 210A. The WDM filter 200 branches WDM signal light into first WDM signal light S1 of a first wavelength band that is an existing band and second WDM signal light S2 of a second wavelength band that is an added band. The first optical monitor section 210A branches and monitors a part of first optical power SA1 including first ASS light and the first WDM signal light S1 of the first wavelength band branched by the WDM filter 200. The second optical monitor section 210B branches and monitors a part of second optical power SA2 including second ASS light and the second WDM signal light S2 of the second wavelength band branched by the WDM filter 200. The second optical monitor section 210B includes a second optical demultiplexer 211B and a second light receiving element 212B. The second optical demultiplexer 211B branches some of the second optical power SA2 of the second wavelength band outputted from the WDM filter 200. The second light receiving element 212B may monitor the second optical power SA2 including the second WDM signal light S2 and the second ASS light of the second wavelength band outputted from the second optical demultiplexer 211B. The first light receiving element 212A may monitor the first optical power SA1 including the first WDM signal light S1 and the first ASS light of the first wavelength band outputted from the first optical demultiplexer 211A.

Figure 13:
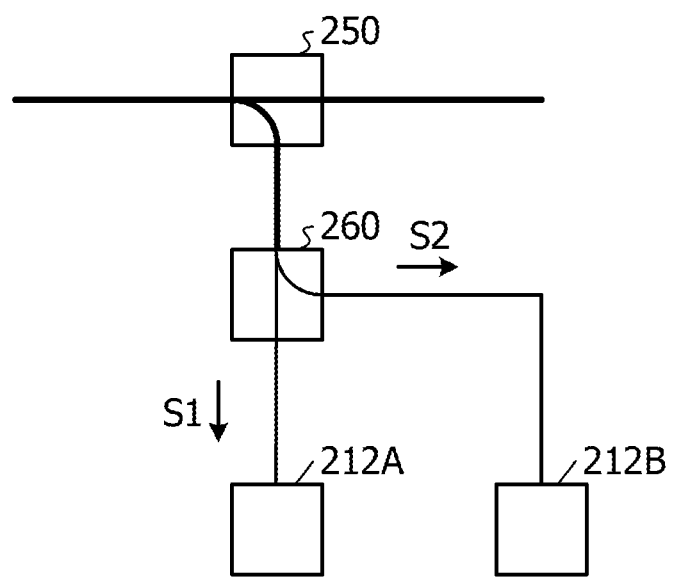
FIG. 13 is an explanatory diagram illustrating an alternative example of an optical monitor unit in the Raman optical amplifier according to Embodiment 3.

FIG. 13 is an explanatory diagram illustrating an alternative example of the optical monitor unit 20 in the Raman optical amplifier 1B according to Embodiment 3. The optical monitor unit 20 is not limited to the example illustrated in FIG. 12, but includes an optical demultiplexer 250, a WDM filter 260, the first light receiving element 212A, and the second light receiving element 212B, as illustrated in FIG. 13. The optical demultiplexer 250 branches some of the optical power including the first and second WDM signal light S1 and S2 of the first and second wavelength bands to be outputted to the subsequent stage from the supply unit 10. The WDM filter 260 outputs the first optical power SA1 including the first WDM signal light S1 of the first wavelength band to the first light receiving element 212A, and also outputs the second optical power SA2 including the second WDM signal light S2 of the second wavelength band to the second light receiving element 212B. The first light receiving element 212A monitors the first optical power SA1 including the first WDM signal light S1 and the first ASS light. The second light receiving element 212B monitors the second optical power SA2 including the second WDM signal light S2 and the second ASS light. The first and second light receiving elements 212A and 212B may be a single unit, or the second light receiving element 212B may be added to the optical monitor unit 20 including the first light receiving element 212A. The configuration may be changed accordingly.

Figure 14:
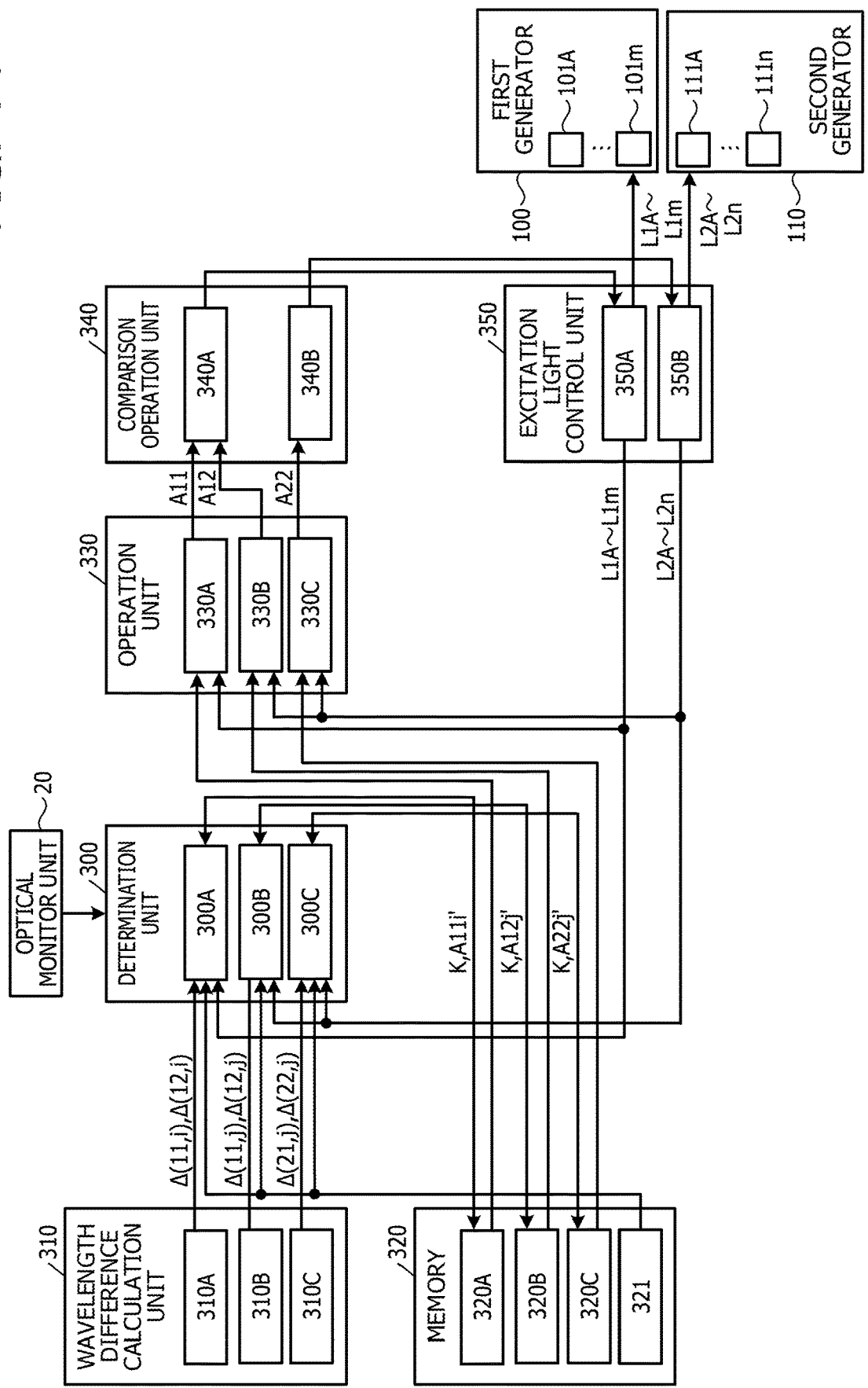
FIG. 14 is an explanatory diagram illustrating an example of a functional configuration of a controller according to Embodiment 3.

FIG. 14 is an explanatory diagram illustrating an example of a functional configuration of the controller 30 in the Raman optical amplifier 1B according to Embodiment 3. The determination unit 300 further includes a third determination section 300C, in addition to the first and second determination sections 300A and 300B. The third determination section 300C determines a third model formula for use in calculation of third ASS light power A22 generated in the second wavelength band with the second excitation light from the second generator 110. The wavelength difference calculation unit 310 further includes a third wavelength difference calculation section 310C, in addition to the first and second wavelength difference calculation sections 310A and 310B. The third wavelength difference calculation section 310C calculates third wavelength differences $\Delta\lambda$ (21, j) and $\Delta\lambda$ (22, j) between end-to-end wavelengths $\lambda 21$ and $\lambda 22$ of the second wavelength band and the second excitation light from the excitation light source 111j (j=1 to n) in the second generator 110. The memory 320 includes a third memory 320C, in addition to the first memory 320A, the second memory 320B, and the wavelength characteristic memory 321. The third memory 320C stores the third model formula for the third ASS light power A22 determined by the third determination section 300C.

Moreover, the operation unit 330 further includes a third operation section 330C, in addition to the first and second operation sections 330A and 330B. The third operation section 330C uses the third model formula stored in the third memory 320C and the excitation light power of the second excitation light to calculate the third ASS light power A22. Furthermore, the comparison operation unit 340 includes a second comparison operation section 340B in addition to the first comparison operation section 340A. The second comparison operation section 340B calculates a second optical power sun that is the sum of the third ASS light power A22 generated in the second wavelength band and second target signal light power T2 of the WDM signal light of the second wavelength band. The second comparison operation section 340B compares the second optical power sum with the second optical power SA2 of the second wavelength band monitored by the second light receiving element 212B. The second comparison operation section 340B generates a control signal for the second generator 110 to control the second synthesized excitation light power L2 such that the second optical power sum corresponds to the second optical power SA2. The second excitation light control section 350B sets the excitation light power of each of the excitation light sources 111A to 111n based on the control signal from the second comparison operation section 340B. The second excitation light control section 350B outputs the excitation light powers L2A to L2n supplied to the transmission optical fiber 2 from the respective excitation light sources 111A to 111n to the second and third operation sections 330B and 330C.

In supplying the second synthesized excitation light L2 for Raman amplification of the second wavelength band to the transmission optical fiber 2 during the course of adding the second wavelength band, the use of the method for measuring the third ASS light power A22 in the same manner as the method for measuring the first ASS light power A11 leads to the following problem.

In the preparatory stage before the start of operation of the second wavelength band, the third ASS light power A22 generated in the second wavelength band with the second synthesized excitation light L2 is measured by varying the excitation light powers L2A to L2n of the second excitation light supplied to the transmission optical fiber 2. However, the measurement by varying the excitation light powers L2A to L2n causes Raman amplification in the first WDM signal light S1 of the first wavelength band by the second synthesized excitation light L2. The first WDM signal light S1 may also reduce a Raman gain of the first wavelength band by the first excitation light control section 350A reducing the first synthesized excitation light power L1. However, since a Raman gain is obtained for measurement to supply the excitation light powers L2A to L2n more than desired, the WDM signal light power S1 of the first wavelength band is controlled more significantly than the first target signal light power T1, resulting in an error in the WDM signal within the first wavelength band.

The third determination section 300C determines the third model formula for calculating the third ASS light power A22 generated in the second wavelength band with the second excitation light, without actually measuring the third ASS light power A22. The third wavelength difference calculation section 310C calculates the third wavelength differences $\Delta\lambda$ (21, j) and $\Delta\lambda$ (22, j) between the end-to-end wavelengths $\lambda$21 and $\lambda$22 of the second wavelength band and the wavelength of the excitation light source 111j (j=1 to n). The third determination section 300C identifies the wavelength characteristics for the excitation light wavelength stored in the wavelength characteristic memory 321 corresponding to the third ASS light power A22j generated in the second wavelength band with the second excitation light from the excitation light source 111j (j=1 to n). The third determination section 300C uses the wavelength characteristics of the third ASS light power A22j and the third wavelength differences $\Delta\lambda$ (21, j) and $\Delta\lambda$ (22, j) to calculate an integrated value A22j' of the third ASS light power A223. The integrated value A22j' of the third ASS light power A22j may be represented by Equation 18.

$$A22j' = \int_{\Delta\lambda(21,j)}^{\Delta\lambda(22,j)} A22j'(\lambda) \quad (18)$$
$$= (\Delta\lambda p(j) - \Delta\lambda(21, j)) \times (R1(111j) + 1)/2 +$$
$$(\Delta\lambda(22, j) - \Delta\lambda p(j)) \times (1 + R2(111j))/2$$

When the peak wavelength of the third ASS light power A22 of the excitation light source 111j is outside the second wavelength band, the integrated value A22j' of the third ASS light power A22j may be represented by Equation 19.

$$A22j' = \int_{\Delta\lambda(21,j)}^{\Delta\lambda(22,j)} A22j'(\lambda) \quad (19)$$
$$= (\Delta\lambda(22, j) - \Delta\lambda(21, j)) \times (R1(111j) + R2(111j))/2$$

Since the common transmission optical fiber 2 is used as the amplification medium for optical signals of all wavelengths, the generation efficiency K achieved by supplying the excitation light power to the transmission optical fiber 2 takes a uniform value regardless of the excitation light wavelength. Therefore, the integrated value A22j' of the third ASS light power A22j generated in the second wavelength band with the second synthesized excitation light L2 may be represented by Equation 20.

$$A22 = K \times \sum_{j=1}^{n}(L2j \times A22j') = \sum_{j=1}^{n}(K \times L2j \times A22j') = \sum_{j=1}^{n}(A22j) \quad (20)$$

To rephrase Equation 20, the third ASS light power A22j may be represented by a value obtained by multiplying the integrated value A22j' of the third ASS light power A22j by the excitation light power L2j of the second excitation light and the generation efficiency K of the transmission optical fiber 2. Then, the third ASS light power A22 may be represented by a total value of the third ASS light power A22j generated in the second wavelength band with the second excitation light from each excitation light source 111j (j=1 to n).

The third determination section 300C stores the determined third model formula for the third ASS light power A22 in the third memory 320C. The third operation section 330C uses the third model formula stored in the third memory 320C and the excitation light powers L2A to L2n set by the second excitation light control section 350B to calculate the third ASS light power A22.

The second comparison operation section 340B calculates the second WDM signal light power S2 of the second wavelength band by subtracting the third ASS light power A22 calculated by the third operation section 330C from the second optical power SA2 of the second wavelength band monitored by the second optical monitor section 210B. The second comparison operation section 340B compares the second WDM signal light power S2 with the second target signal light power T2 of the WDM signal light of the second wavelength band after Raman amplification. The second comparison operation section 340B generates a control signal for the second generator 110 to control the second synthesized excitation light power L2 such that the second WDM signal light power S2 corresponds to the second target signal light power T2. The second excitation light control section 350B sets the excitation light power from each of the excitation light sources 111A to 111n based on the control signal from the second comparison operation section 340B.

With the Raman optical amplifier 1B according to Embodiment 3, the third model formula is determined without measuring the third ASS light power A22 generated in the second wavelength band that is the added band, at the stage of adding a band to the WDM system. As a result, the wavelength band of the WDM signal may be expanded while ensuring the transmission performance in the existing band without causing any error in the WDM signal within the first wavelength band.

The controller 30 calculates the third ASS light power A22 generated in the second wavelength band with the second excitation light, which corresponds to the second excitation light power. The controller 30 calculates the second WDM signal light power S2 by subtracting the calculated third ASS light power A22 from the second optical power SA2 measured by the second optical monitor section 210B. The controller 30 controls the second generator 110 to adjust the second excitation light, based on a difference between the second WDM signal light power S2 and the second target signal light power T2. As a result, stable transmission performance may be ensured by accurately calculating the third ASS light power A22 generated in the second wavelength band, even when a different wavelength band is added.

For example, the comparison operation unit 340 calculates a second optical power sum that is the sum of the third ASS light power A22 generated in the second wavelength band and the second target signal light power T2 of the WDM signal light of the second wavelength band. Then, the comparison operation unit 340 may compare the second optical power sum with the second optical power SA2 monitored by the second optical monitor section 210B. In this case, the comparison operation unit 340 generates a control signal for the second generator 110 to control the second synthesized excitation light power L2 such that the second optical power SA2 corresponds to the second optical power sum.

The third determination section 300C, the third wavelength difference calculation section 310C, the third memory 320C, the third operation section 330C, and the second comparison operation section 340B may be provided in the Raman optical amplifier 1A according to Embodiment 2, and the configuration may be modified accordingly. In this case, the same effect as that of Embodiment 3 is achieved, in addition to the effect of Embodiment 2.

Embodiment 4

In the configuration where the wavelength bands are not away from each other, such as the C band and the L band, the wavelength characteristics of the ASS light generated by the Raman effect caused by the excitation light are attenuated from the peak wavelength of Raman amplification to the long-wavelength side 30 nm as illustrated in FIG. 5. As a result, the first synthesized excitation light power L1 may generate fourth ASS light power A21 in the second wavelength band.

Figure 15:
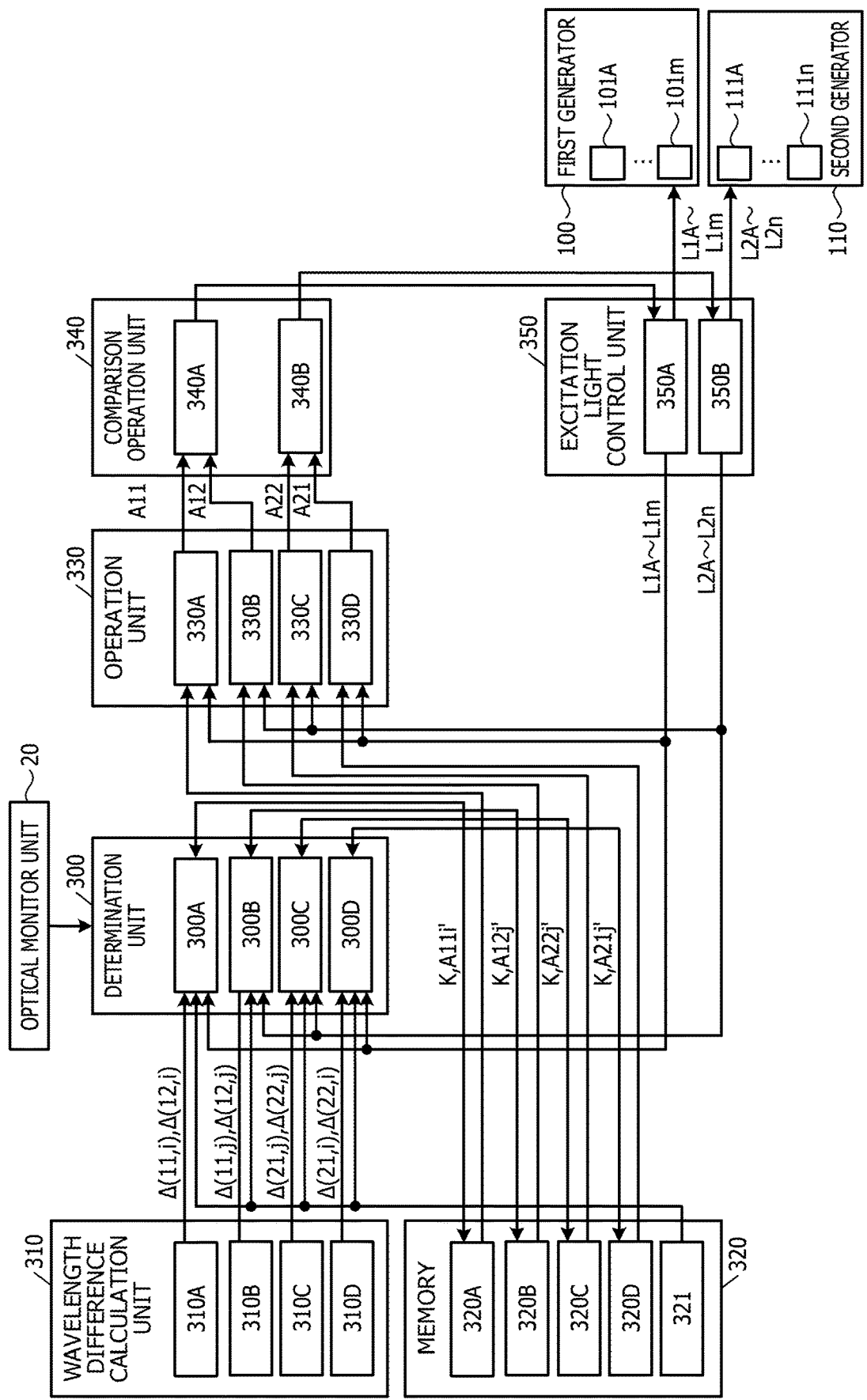
FIG. 15 is an explanatory diagram illustrating an example of a functional configuration of a controller according to Embodiment 4.

FIG. 15 is a block diagram illustrating an example of a functional configuration of a controller 30 according to Embodiment 4. As for a Raman optical amplifier 1C according to Embodiment 4, the same constituent components as those in the Raman optical amplifier 1B according to Embodiment 3 are denoted by the same reference numerals, and repetitive description of the configuration and operations thereof is omitted. A determination unit 300 in the controller 30 includes a fourth determination section 300D to determine a fourth model formula for use in calculation of fourth ASS light power A21 generated in the second wavelength band with the first synthesized excitation light power L1. An operation unit 330 includes a fourth operation section 330D that uses the fourth model formula to calculate the fourth ASS light power A21.

The determination unit 300 illustrated in FIG. 15 includes the fourth determination section 300D, in addition to the first determination section 300A, the second determination section 300B, and the third determination section 300C. The fourth determination section 300D determines the fourth model formula for use in calculation of the fourth ASS light power A21. The wavelength difference calculation unit 310 includes a fourth wavelength difference calculation section 310D, in addition to the first wavelength difference calculation section 310A, the second wavelength difference calculation section 310B, and the third wavelength difference calculation section 310C. The fourth wavelength difference calculation section 310D calculates fourth wavelength differences $\Delta\lambda$ (21, i) and $\Delta\lambda$ (22, i) between end-to-end wavelengths $\lambda 21$ and $\lambda 22$ of the second wavelength band and the wavelength of the first excitation light from the excitation light source 101$i$ (i=1 to m). The memory 320 includes a fourth memory 320D, in addition to the first memory 320A, the second memory 320B, the third memory 320C, and the wavelength characteristic memory 321. The fourth determination section 300D stores the determined fourth model formula in the fourth memory 320D. The operation unit 330 includes a fourth operation section 330D, in addition to the first operation section 330A, the second operation section 330B, and the third operation section 330C. The fourth operation section 330D uses the fourth model formula stored in the fourth memory 320D and the excitation light power of the first excitation light to calculate the fourth ASS light power A21 generated in the second wavelength band with the first synthesized excitation light power L1. The second comparison operation section 340B calculates second total ASS light power A2 by adding up the fourth ass light power A21 and the third ASS light power A22 generated in the second wavelength band. The second comparison operation section 340B calculates a second optical power sum that is the sum of the second total ASS light power A2 and the second target signal light power T2 of the WDM signal light of the second wavelength band. The second comparison operation section 340B compares the second optical power sum with the second optical power SA2 of the second wavelength band monitored by the second light receiving element 212B. The second comparison operation section 340B generates a control signal for the second generator 110 to control the second synthesized excitation light power L2 such that the second optical power sum corresponds to the second optical power SA2. The second excitation light control section 350B outputs the values set for the excitation light powers L2A to L2$n$ of the second excitation light from the respective excitation light sources 111A to 111$n$ to the first operation section 330A and the fourth operation section 330D.

The fourth determination section 300D determines the fourth model formula for the fourth ASS light power A21. The fourth wavelength difference calculation section 310D calculates the fourth wavelength differences $\Delta\lambda$ (21, i) and $\Delta\lambda$ (22, i). The fourth determination section 300D uses the wavelength characteristics for the excitation light wavelength of the fourth ASS light power A21$i$ generated in the second wavelength band with the first excitation light and the fourth wavelength differences $\Delta\lambda$ (21, i) and $\Delta\lambda$ (22, i) to calculate an integrated value A21$i'$ of the fourth ASS light power A21$i$. The integrated value A21$i'$ of the fourth ASS light power A21$i$ may be represented by Equation 21.

$$A21i' = \int_{\Delta\lambda(21,i)}^{\Delta\lambda(22,i)} A21i'(\lambda) \qquad (21)$$
$$= (\Delta\lambda p(i) - \Delta\lambda(21, i)) \times (R1(101i) + 1)/2 +$$
$$(\Delta\lambda(22, i) - \Delta\lambda p(i)) \times (1 + R2(101i))/2$$

When the peak wavelength of the fourth ASS light power A21 generated by the first excitation light from the excitation light source 101$i$ is outside the second wavelength band, the integrated value A21$i'$ of the fourth ASS light power A21$i$ may be represented by Equation 22.

$$A21i' = \int_{\Delta\lambda(21,i)}^{\Delta\lambda(22,i)} A21i'(\lambda) \qquad (22)$$
$$= (\Delta\lambda(22, i) - \Delta\lambda(21, i)) \times (R1(101i) + R2(101i))/2$$

Since the common transmission optical fiber 2 is used as the amplification medium for optical signals of all wavelengths, the generation efficiency K achieved by the excitation light power takes a uniform value regardless of the excitation light wavelength. Therefore, the integrated value A21$i'$ of the fourth ASS light power A21$i$ may be represented by Equation 23.

$$A21 = K \times \sum_{i=1}^{m}(L1i \times A21i') = \sum_{i=1}^{m}(K \times L1i \times A21i') = \sum_{i=1}^{m}(A21i) \qquad (23)$$

To rephrase Equation 23, the fourth ASS light power A21$i$ may be represented by a value obtained by multiplying the integrated value A21*i*' of the fourth ASS light power A21*i* by the excitation light power L1*i* of the first excitation light and the generation efficiency K. Then, the fourth ASS light power A21 may be represented by a total value of the fourth ASS light power A21*i* generated in the second wavelength band with the first excitation light from each excitation light source 101*i* (i=1 to m).

The fourth determination section 300D stores the determined fourth model formula for the fourth ASS light power A21 in the fourth memory 320D. The fourth operation section 330D uses the fourth model formula stored in the fourth memory 320D and the excitation light powers L1A to L1*m* set by the first excitation light control section 350A to calculate the fourth ASS light power A21.

The second comparison operation section 340B calculates the second total ASS light power A2 by adding up the third ASS light power A22 and the fourth ASS light power A21 calculated by the third operation section 330C and the fourth operation section 330D, respectively. The second comparison operation section 340B calculates the second WDM signal light power S2 of the second wavelength band by subtracting the second total ASS light power A2 from the second optical power SA2 of the second wavelength band monitored by the second optical monitor section 210B. The second comparison operation section 340B compares the second total ASS light power A2 with the second target signal light power T2 of the WDM signal light of the second wavelength band after Raman amplification. The second comparison operation section 340B generates a control signal for the second synthesized excitation light power L2 such that the second total ASS light power A2 corresponds to the second target signal light power T2. The second excitation light control section 350B sets the excitation light power from each of the excitation light sources 111A to 111*n* based on the control signal from the second comparison operation section 340B.

Figure 16:
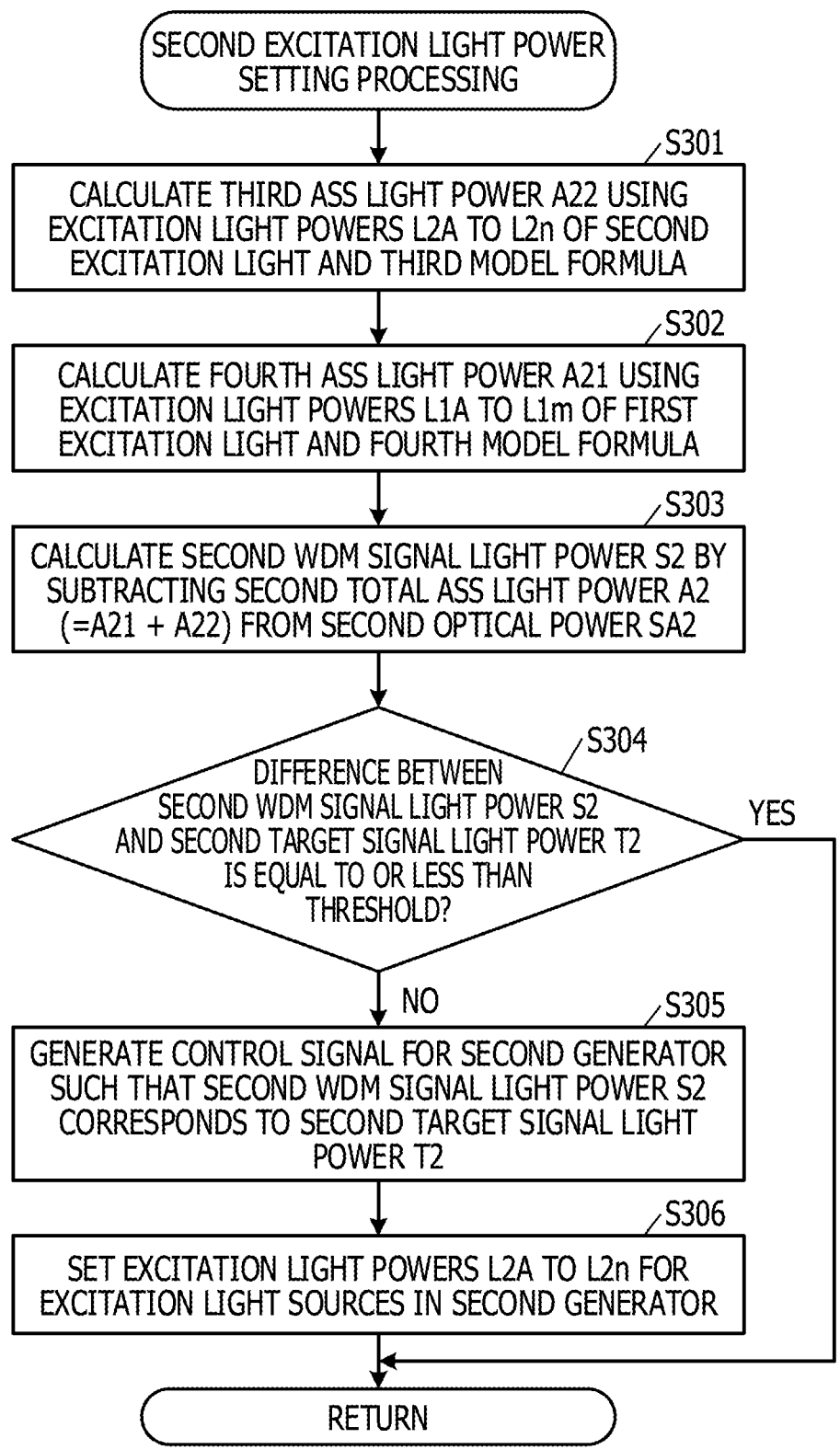
FIG. 16 is a flowchart illustrating an example of processing operations by the controller, regarding second excitation light power setting processing.

FIG. 16 is a flowchart illustrating an example of processing operations by the controller 30, regarding second excitation light power setting processing. The second excitation light power setting processing is processing of calculating second WDM signal light power S2 by using the third ASS light power A22 and the fourth ASS light power A21 as well as the second optical power SA2 as the monitor result at the stage of adding an excitation light source for Raman amplification. Furthermore, the second excitation light power setting processing is processing of controlling the excitation light power of the second excitation light such that the calculated second WDM signal light power S2 corresponds to the second target signal light power T2 after the Raman amplification.

The third operation section 330C uses the third model formula stored in the third memory 320C and the excitation light powers L2A to L2*n* of the second excitation light set by the second excitation light control section 350B to calculate the third ASS light power A22 (Step S301). The fourth operation section 330D uses the fourth model formula stored in the fourth memory 320D and the excitation light powers L1A to L1*m* of the first excitation light set by the first excitation light control section 350A to calculate the fourth ASS light power A21 (Step S302).

The second comparison operation section 340B calculates the second total ASS light power A2 by adding up the calculated third ASS light power A22 and fourth ASS light power A21. The second comparison operation section 340B calculates the second WDM signal light power S2 by subtracting the calculated second total ASS light power A2 from the second optical power SA2 of the second wavelength band monitored by the second optical monitor section 210B (Step S303). The second WDM signal light power S2 may be represented by Equation 24.

$$S2=SA2-A2=SA2-(A22+A21) \quad (24)$$

The second comparison operation section 340B determines whether or not a difference between the calculated second WDM signal light power S2 and the second target signal light power T2 of the WDM signal light of the second wavelength band after Raman amplification is not more than a previously set threshold (for example, 0.5 dB) (Step S304). When the difference is not equal to or less than the threshold (No in Step S304), the second comparison operation section 340B generates a control signal for the second generator 110 (Step S305). The second comparison operation section 340B generates the control signal for the second generator 110 to control the second synthesized excitation light power L2 such that the second WDM signal light power S2 corresponds to the second target signal light power T2. The second excitation light control section 350B sets the excitation light powers L2A to L2*n* for the respective excitation light sources 111A to 111*n* based on the control signal from the second comparison operation section 340B (Step S306), and then terminates the processing of Step S207 illustrated in FIG. 8.

Figure 18:
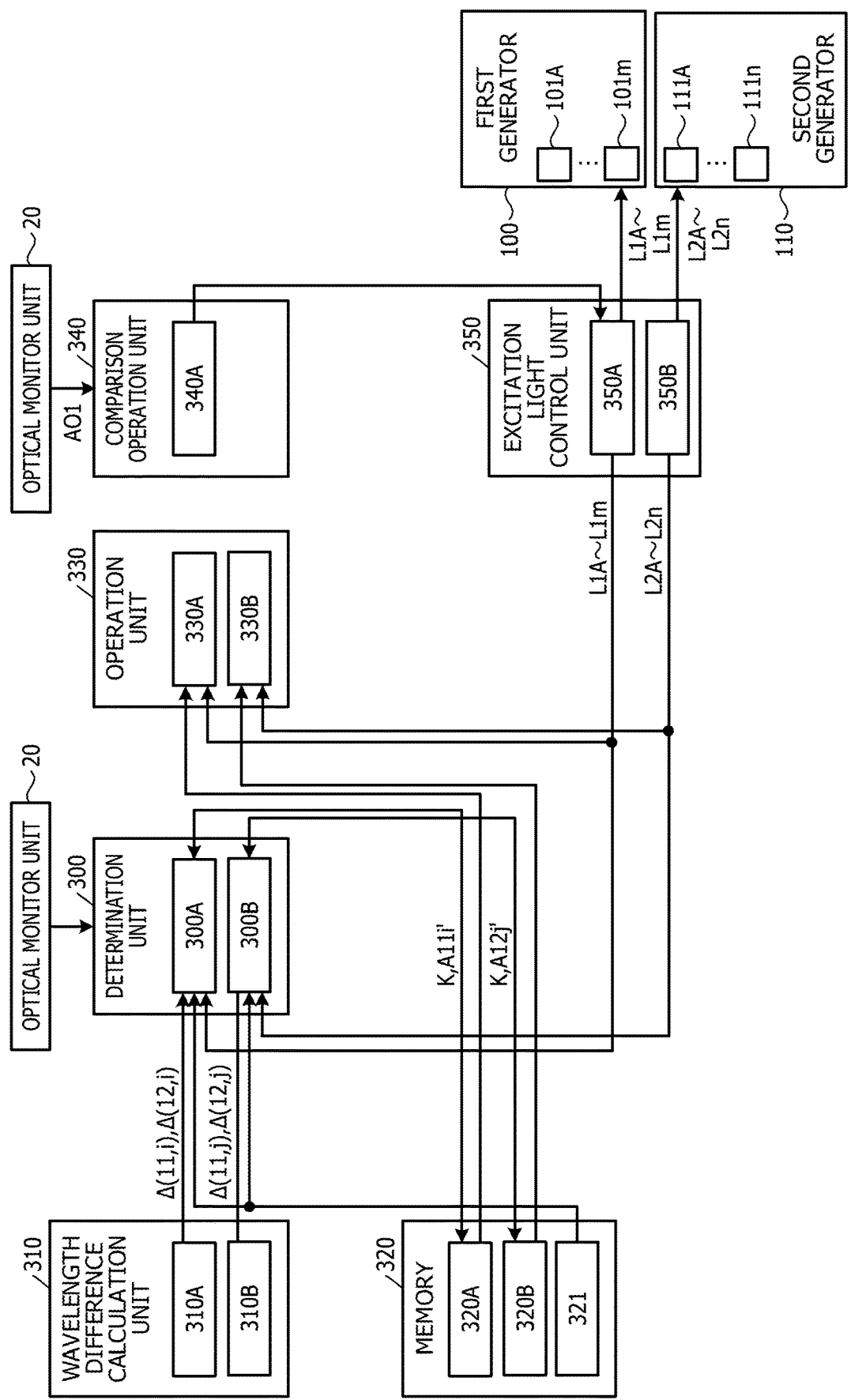
FIG. 18 is a diagram illustrating a configuration example of a controller according to Embodiment 5.

The controller 30 executes the processing illustrated in FIGS. 8 and 18 to control the first WDM signal light power S1 and the second WDM signal light power S2 to be the target signal light power T1 and T2 for achieving transmission performance desired for the optical transmission system.

The Raman optical amplifier 1C according to Embodiment 4 may determine the fourth model formula for calculating the fourth ASS light power A21 without measuring the ASS light power generated in the second wavelength band that is the added band at the stage of adding a band to the WDM optical transmission system. As a result, stable transmission performance may be ensured even when a band is added.

The controller 30 calculates the fourth ASS light power A21 generated in the second wavelength band with the first excitation light, which corresponds to the first excitation light power, and also calculates the third ASS light power A22 generated in the second wavelength band with the second excitation light, which corresponds to the second excitation light power. The controller 30 calculates the second WDM signal light power S2 by subtracting the calculated third ASS light power A22 and fourth ASS light power A21 from the second optical power SA2 measured by the second optical monitor section 210B. The controller 30 further controls the second generator 110 to adjust the second excitation light, based on a difference between the second WDM signal light power S2 and the second target signal light power T2. As a result, stable transmission performance may be ensured since the second WDM signal light power S2 may be accurately calculated by accurately calculating the third ASS light power A22 and fourth ASS light optical power A21 generated in the second wavelength band, even when a different wavelength band is added.

The controller 30 determines the third model formula for use in calculation of the third ASS light power, based on the integrated value of the third ASS light power A22 corresponding to the third wavelength difference. The controller 30 further determines the fourth model formula for use in calculation of the fourth ASS light power A21, based on the integrated value of the fourth ASS light power A21 corresponding to the fourth wavelength difference. As a result, the third ASS light power A22 and the fourth ASS light power A21 generated in the second wavelength band with the second excitation light by adding a band may be accurately calculated using the third and fourth model formulas.

The comparison operation unit 340 may calculate the second optical power sum that is the sum of the fourth ASS light power A21 and the second target signal light power T2 of the WDM signal light of the second wavelength band. In this case, the comparison operation unit 340 compares the second optical power sum with the second optical power SA2 monitored by the second optical monitor section 210B. Then, the comparison operation unit 340 generates a control signal for the second synthesized excitation light power L2 such that the second optical power SA2 corresponds to the second optical power sum.

The Raman optical amplifiers 1A and 1B according to Embodiments 2 and 3 may have functions to determine the fourth model formula for the fourth ASS light power A21 and to calculate the second WDM signal light power S2 with the fourth model formula, as in the case of Embodiment 4, and may be modified accordingly.

Embodiment 5

Figure 17:
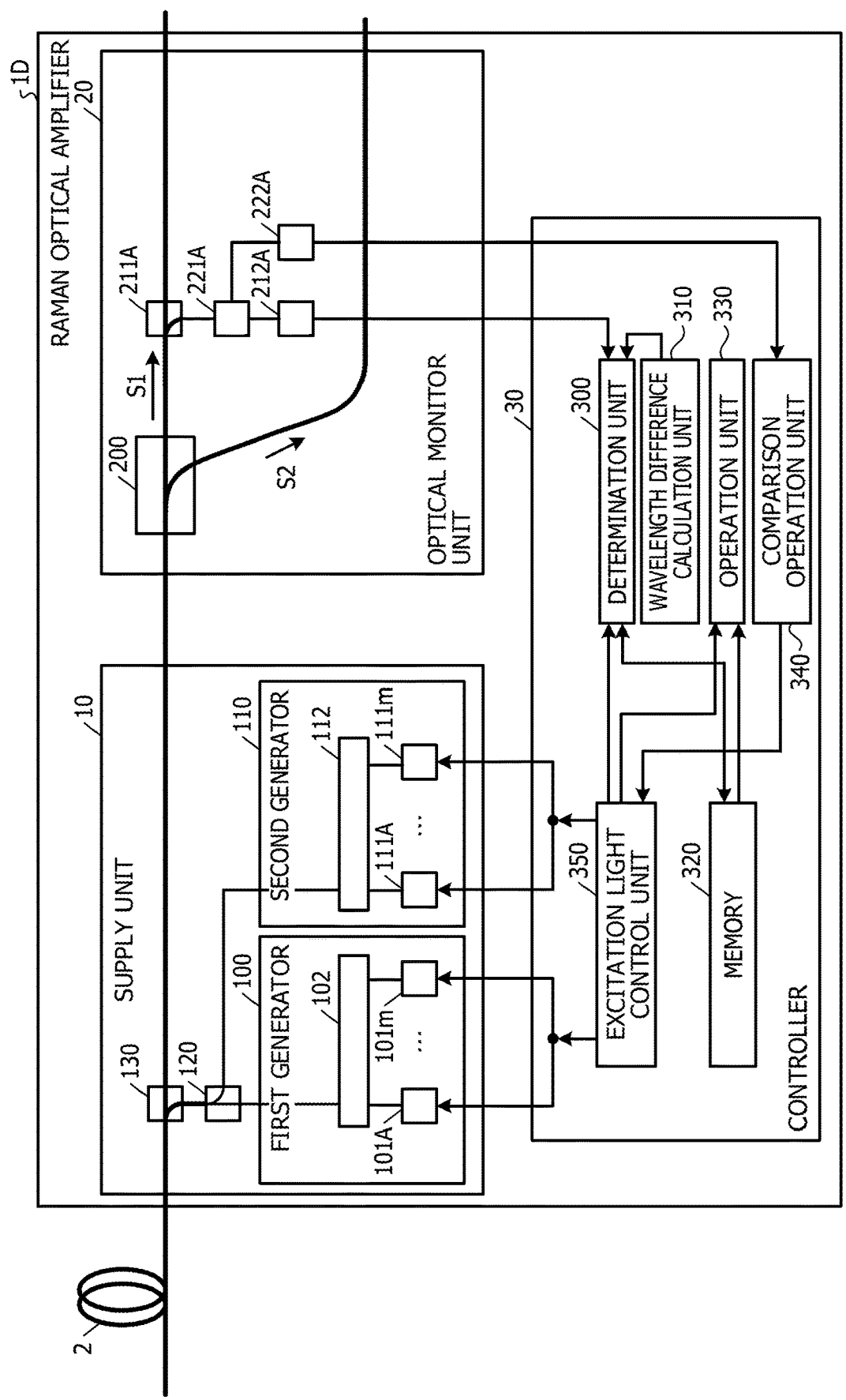
FIG. 17 is an explanatory diagram illustrating an example of a Raman optical amplifier according to Embodiment 5.

FIG. 17 is an explanatory diagram illustrating an example of a Raman optical amplifier 1D according to Embodiment 5. The same constituent components as those in the Raman optical amplifier 1 according to Embodiment 1 are denoted by the same reference numerals, and repetitive description of the configuration and operations thereof is omitted. An optical monitor unit 20 illustrated in FIG. 17 includes a first optical demultiplexer 211A, a first filter 221A, a first light receiving element 212A, and a first out-of-band monitor section 222A.

The first optical demultiplexer 211A outputs some of first WDM signal light power S1 of WDM signal light of a first wavelength band branched by a WDM filter 200 to the first filter 221A. The first filter 221A outputs the WDM signal light of the first wavelength band to the first light receiving element 212A. The first filter 221A outputs ASS light power to the first out-of-band monitor section 222A, the ASS light power being WDM signal light of a wavelength band other than the first wavelength band and being generated near the WDM signal wavelength of the first wavelength band. The first light receiving element 212A monitors the WDM signal light of the first wavelength band and outputs the monitoring result to the determination unit 300. The first out-of-band monitor section 222A monitors ASS light power and outputs the monitoring result to the comparison operation unit 340.

FIG. 18 is a diagram illustrating a configuration example of a controller 30 according to Embodiment 5. A first comparison operation section 340A in the controller 30 illustrated in FIG. 18 compares first out-of-band ASS optical power AO1 monitored by the first out-of-band monitor section 222A with first target ASS light power TO1 determined from a desired Raman gain of the first wavelength band. The first comparison operation section 340A generates a control signal for the first generator 100 to control first synthesized excitation light power L1 such that the first out-of-band ASS optical power AO1 corresponds to the first target ASS light power TO1.

The Raman gain of the wavelength band for Raman amplification and the ASS light power to be generated have a uniform linear correlation regardless of the characteristics of the transmission optical fiber to be the amplification medium, in the case of the same fiber type. This means that the ASS light power to be generated is determined when the fiber type and the desired gain are determined. In Embodiment 5, with the use of the linear correlation between the Raman gain and the ASS light power, the ASS light power generated by the desired Raman gain is set as the target ASS light power, and the excitation light power is controlled such that the ASS light power to be monitored corresponds to the target ASS light power.

Figure 19:
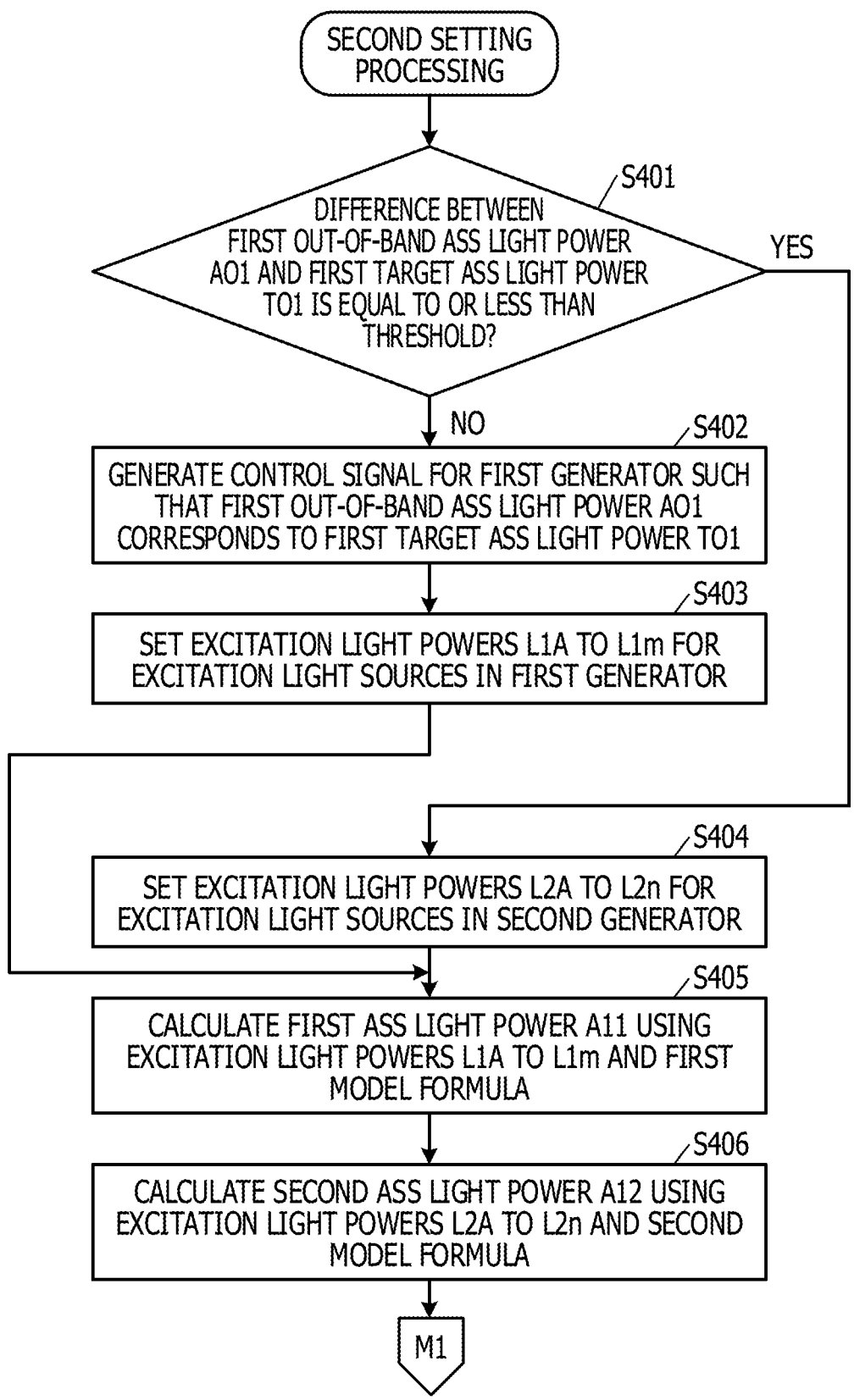
FIG. 19 is a flowchart illustrating an example of processing operations by the controller, regarding second setting processing.

Next, description is given of operations of the Raman optical amplifier 1D according to Embodiment 5 at the execution stage of an actual operation. FIG. 19 is a flowchart illustrating an example of processing operations by the controller 30, regarding second setting processing. The first comparison operation section 340A compares the first target ASS light power TO1 determined from the desired Raman gain of the first wavelength band with the first out-of-band ASS optical power AO1 monitored by the first out-of-band monitor section 222A. The first comparison operation section 340A determines whether or not a difference between the first out-of-band ASS light power AO1 and the first target ASS light power TO1 is not more than a previously set threshold (for example, 0.5 dB) (Step S401).

When the difference between the first out-of-band ASS light power AO1 and the first target ASS light power TO1 is not equal to or less than the threshold (No in Step S401), the first comparison operation section 340A generates a control signal for the first generator 100 (Step S402). The first comparison operation section 340A generates the control signal for the first generator 100 to control the first synthesized excitation light power L1 such that the first out-of-band ASS light power AO1 corresponds to the first target ASS light power TO1. The first excitation light control section 350A sets the excitation light powers L1A to L1$m$ of the first excitation light from the respective excitation light sources 101A to 101$m$, based on the control signal from the first comparison operation section 340A (Step S403). The first operation section 330A uses the excitation light powers L1A to L1$m$ of the first excitation light and the first model formula to calculate the first ASS light power A11 (Step S405). The second operation section 330B uses the excitation light powers L2A to L2$n$ of the second excitation light and the second model formula to calculate the second ASS light power A12 (Step S406), and then moves to M1 illustrated in FIG. 8. When the difference between the first out-of-band ASS light power AO1 and the first target ASS light power TO1 is equal to or less than the threshold (Yes in Step S401), the second excitation light control section 350B moves to Step S404 to set the excitation light powers L2A to L2$n$ of the second excitation light.

The Raman optical amplifier 1D determines the model formula without measuring the ASS light power generated in the added band at the stage of band addition, even in the configuration where the first out-of-band ASS light power AO1 is controlled to be the desired Raman gain so as to correspond to the first target ASS light power TO1. Thus, the Raman optical amplifier 1D may use the model formula to calculate the ASS light power generated in the signal band. As a result, the wavelength band of the WDM signal capable of band addition may be expanded while accurately managing a signal-to-noise ratio of the WDM signal of the existing band.

The controller 30 measures the first out-of-band ASS light power AO1 generated outside the first wavelength band. The controller 30 calculates a difference between the measured first out-of-band ASS light power AO1 and the first target ASS light power TO1 determined from the desired Raman gain of the first wavelength band. The controller 30 controls the first generator 100 or the second generator 110 to adjust the first excitation light or the second excitation light, based on the difference between the first out-of-band ASS light power AO1 and the first target ASS light power TO1. As a result, the model formula is determined without measuring the ASS light power generated in the added band at the stage of addition of a different wavelength band, and the first ASS light power A11 and the second ASS light power A12 may be accurately calculated. Also, stable transmission performance may be ensured by accurately calculating the second ASS light power generated in the first wavelength band even when a different wavelength band is added.

Embodiment 6

Figure 20:
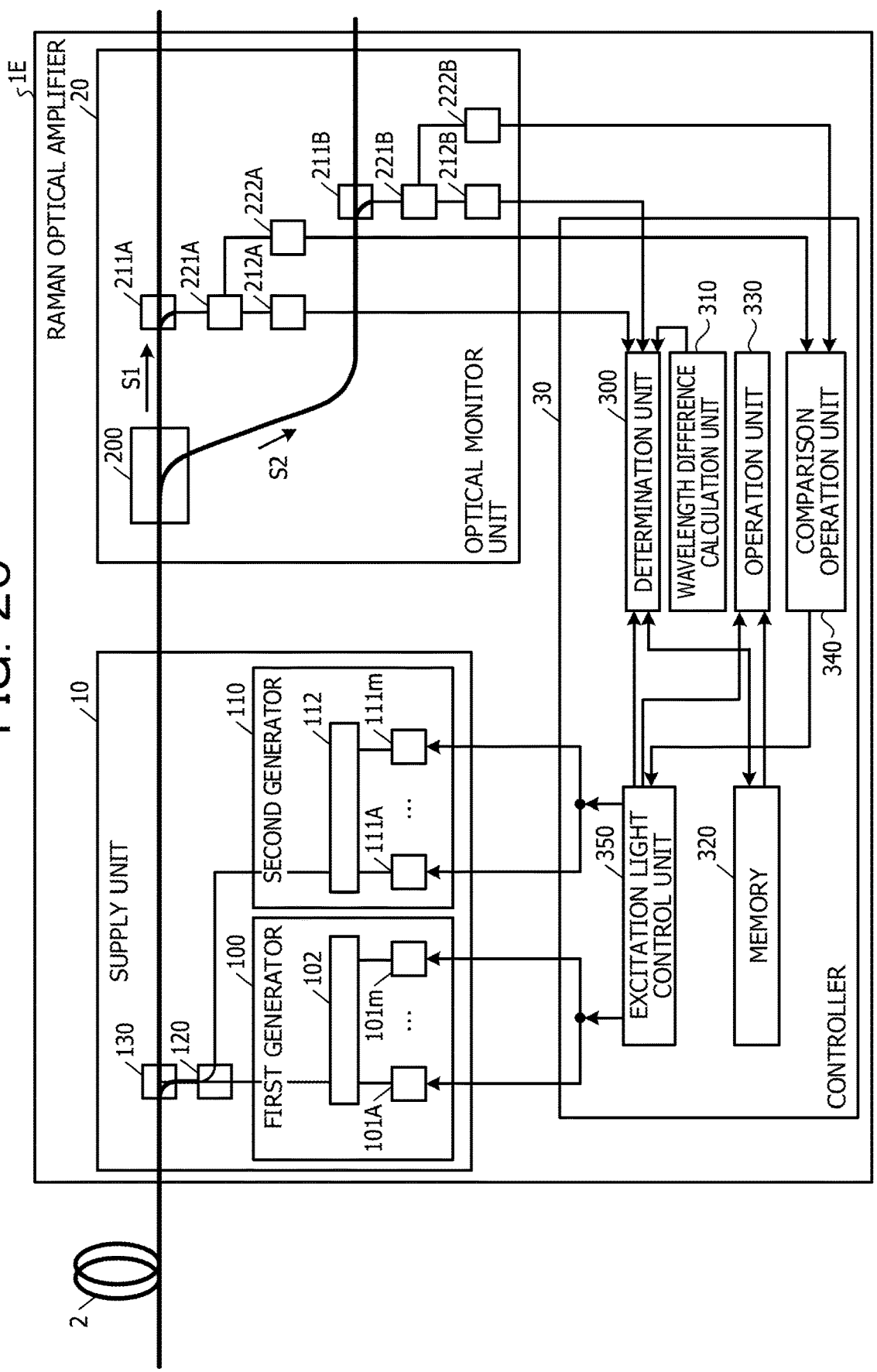
FIG. 20 is an explanatory diagram illustrating an example of a Raman optical amplifier according to Embodiment 6.

FIG. 20 is an explanatory diagram illustrating an example of a Raman optical amplifier 1E according to Embodiment 6. The same constituent components as those in the Raman optical amplifier 1D according to Embodiment 5 are denoted by the same reference numerals, and repetitive description of the configuration and operations thereof is omitted. An optical monitor unit 20 illustrated in FIG. 20 includes a first optical demultiplexer 211A, a first filter 221A, a first light receiving element 212A, and a first out-of-band monitor section 222A. The optical monitor unit 20 also includes a second optical demultiplexer 211B, a second filter 221B, a second light receiving element 212B, and a second out-of-band monitor section 222B.

The first optical demultiplexer 211A outputs some of first WDM signal light power S1 of WDM signal light of a first wavelength band branched by a WDM filter 200 to the first filter 221A. The first filter 221A outputs the WDM signal light of the first wavelength band to the first light receiving element 212A. The first filter 221A outputs ASS light power to the first out-of-band monitor section 222A, the ASS light power being WDM signal light of a wavelength band other than the first wavelength band and being generated near the WDM signal wavelength of the first wavelength band. The first light receiving element 212A monitors the WDM signal light of the first wavelength band and outputs the monitoring result to the determination unit 300. The first out-of-band monitor section 222A monitors ASS light power and outputs the monitoring result to the comparison operation unit 340.

The second optical demultiplexer 211B outputs some of second WDM signal light power S2 of WDM signal light of a second wavelength band branched by the WDM filter 200 to the second filter 221B. The second filter 221B outputs the WDM signal light of the second wavelength band to the second light receiving element 212B. The second filter 221B outputs ASS light power to the second out-of-band monitor section 222B, the ASS light power being WDM signal light of a wavelength band other than the second wavelength band and being generated near the WDM signal wavelength of the second wavelength band. The second light receiving element 212B monitors the WDM signal light used in the second wavelength band and outputs the monitoring result to the determination unit 300. The second out-of-band monitor section 222B monitors ASS light power and outputs the monitoring result to the comparison operation unit 340.

FIG. 21 is an explanatory diagram illustrating an example of a functional configuration of the controller 30 according to Embodiment 6. The first comparison operation section 340A in the controller 30 illustrated in FIG. 21 compares the first out-of-band ASS optical power AO1 monitored by the first out-of-band monitor section 222A with the first target ASS light power TO1 determined from the desired Raman gain of the first wavelength band. The first comparison operation section 340A generates a control signal for the first generator 100 to control the first synthesized excitation light power L1 such that the first out-of-band ASS optical power AO1 corresponds to the first target ASS light power TO1. The second comparison operation section 340B compares the second out-of-band ASS optical power AO2 monitored by the second out-of-band monitor section 222B with the second target ASS light power TO2 determined from the desired Raman gain of the second wavelength band. The first comparison operation section 340A generates a control signal for the second generator 110 to control the second synthesized excitation light power L2 such that the second out-of-band ASS optical power AO2 corresponds to the second target ASS light power TO2. The second comparison operation section 340B compares the second target ASS light power TO2 determined from the desired Raman gain of the second wavelength band with the second out-of-band ASS optical power AO2 monitored by the second out-of-band monitor section 222B. The second comparison operation section 340B determines whether or not a difference between the second out-of-band ASS optical power AO2 and the second target ASS light power TO2 is not more than a previously set threshold (for example, 0.5 dB).

When the difference between the second out-of-band ASS optical power AO2 and the second target ASS light power TO2 is not equal to or less than the threshold, the second comparison operation section 340B generates a control signal for the second generator 110 to control the second synthesized excitation light power L2. That is, the second comparison operation section 340B generates the control signal for the second generator 110 to control the second synthesized excitation light power L2 such that the second out-of-band ASS optical power AO2 corresponds to the second target ASS light power TO2. The second excitation light control section 350B sets the excitation light powers L2A to L2$n$ from the respective excitation light sources 111A to 111$n$, based on the control signal from the second comparison operation section 340B.

The second operation section 330B uses the excitation light powers L2A to L2$n$ of the second excitation light and the fourth model formula to calculate the fourth ASS light power A21. The first operation section 330A uses the excitation light powers L1A to L1$m$ of the first excitation light and the third model formula to calculate the third ASS light power A22. When the difference between the second out-of-band ASS optical power AO2 and the second target ASS light power TO2 is equal to or less than the threshold, the first excitation light control section 350A sets the excitation light powers L1A to L1$m$ of the first excitation light for the respective excitation light sources 101A to 101$m$.

The controller 30 calculates the first ASS light power A11 generated in the first wavelength band with the first excitation light, corresponding to the first excitation light power, and the second ASS light power A12 generated in the first wavelength band with the second excitation light, corresponding to the second excitation light power. The controller 30 calculates the first WDM signal light power S1 by subtracting the calculated first ASS light power A11 and second ASS light power A12 from the first optical power SA1 measured by the first optical monitor section 210A. The controller 30 further controls the first generator 100 or the second generator 110 to adjust the first excitation light or the second excitation light, based on a difference between the first WDM signal light power S1 and the first target signal light power T1.

The Raman optical amplifier 1E determines the model formula without measuring the ASS light power generated in the added band at the stage of band addition, even in the configuration where the second out-of-band ASS optical power AO2 is controlled to be the desired Raman gain so as to correspond to the second target ASS light power TO2. Thus, the Raman optical amplifier 1E may calculate the ASS light power generated in the signal band. As a result, the wavelength band of the WDM signal may be expanded while accurately managing a signal-to-noise ratio of the WDM signal of the existing band.

The controller 30 measures the second out-of-band ASS optical power AO2 generated outside the second wavelength band. The controller 30 calculates a difference between the measured second out-of-band ASS optical power AO2 and the second target ASS light power TO2 determined from the desired Raman gain of the second wavelength band. The controller 30 controls the first generator 100 or the second generator 110 to adjust the first excitation light or the second excitation light, based on the difference between the second out-of-band ASS optical power AO2 and the second target ASS light power TO2. As a result, the model formula is determined without measuring the ASS light power generated in the added band at the stage of addition of a different wavelength band, and the first ASS light power A11 and the second ASS light power A12 may be accurately calculated.

In the Raman optical amplifiers 1 according to Embodiments 1 to 6, the model formulas for the first and second synthesized excitation light powers L1 and L2 and the first and second ASS light powers generated in the first and second wavelength bands are managed for each fiber type. The Raman optical amplifiers 1 may be configured to correct coefficients used in each of the model formulas based on the measurement result of the excitation light power and ASS light power measured by the determination unit 300 at the preparatory stage before operation of the first wavelength band, and may also be modified accordingly.

Figure 22A:
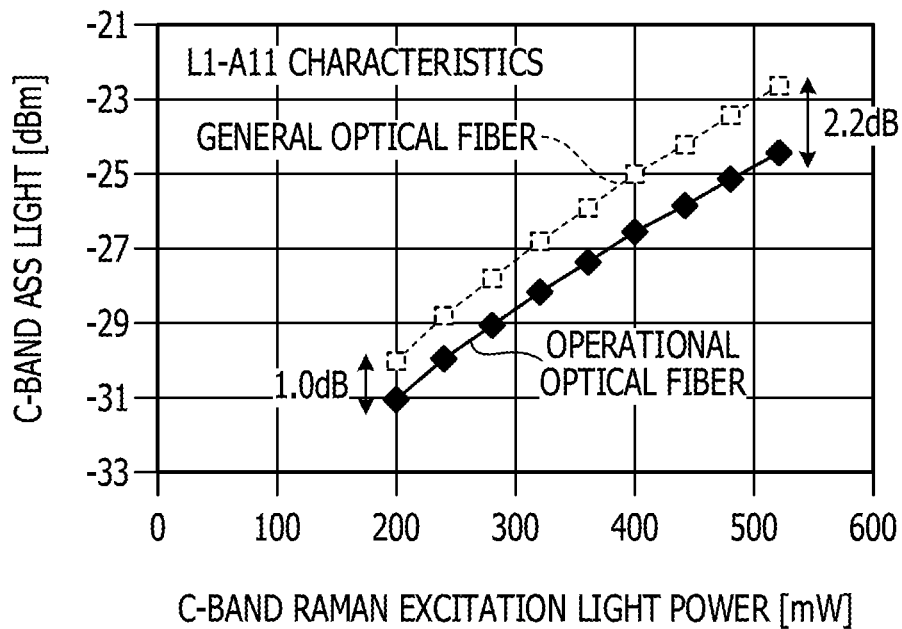
FIG. 22A is an explanatory diagram illustrating an example of a relationship between first synthesized excitation light L1 and first ASS light power A11.

FIG. 22A is an explanatory diagram illustrating an example of a relationship between the first synthesized excitation light L1 and the first ASS light power A11. The characteristics illustrated in FIG. 22A represent, in the case of a general optical fiber, a change in the first ASS light power A11 (broken line) occurring in the first wavelength band (C band) as a function of a change in the first synthesized excitation light L1. The characteristics represent, in an operational optical fiber, a change in the first ASS light power A11 (solid line) occurring in the first wavelength band (C band) as a function of a change in the first synthesized excitation light L1. The characteristics illustrated in FIG. 22A represent the first model formula for use in calculation of the first ASS light power A11. The operational optical fiber may suppress the first ASS light power A11 compared with the general optical fiber.

Figure 22B:
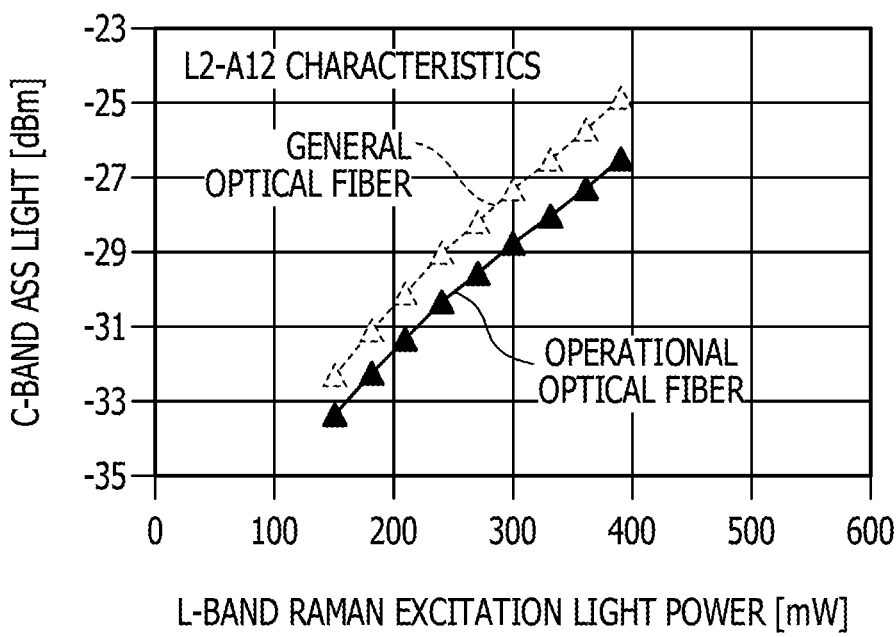
FIG. 22B is an explanatory diagram illustrating an example of a relationship between second synthesized excitation light L2 and second ASS light power A12.

FIG. 22B is an explanatory diagram illustrating an example of a relationship between the second synthesized excitation light L2 and the second ASS light power A12. The characteristics illustrated in FIG. 22B represent, in the case of a general optical fiber, a change in the second ASS light power A12 (broken line) occurring in the first wavelength band (C band) as a function of a change in the second synthesized excitation light L2. The characteristics represent, in an operational optical fiber, a change in the second ASS light power A12 (solid line) occurring in the first wavelength band (C band) as a function of a change in the second synthesized excitation light L2. The characteristics illustrated in FIG. 22B represent the second model formula for use in calculation of the second ASS light power A12. The operational optical fiber may suppress the second ASS light power A12 compared with the general optical fiber.

Figure 22C:
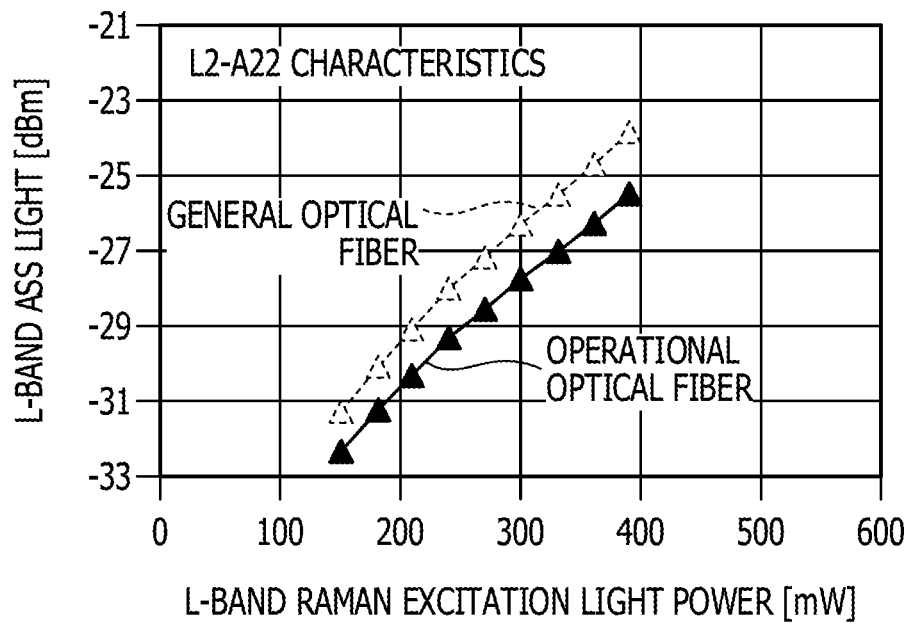
FIG. 22C is an explanatory diagram illustrating an example of a relationship between the second synthesized excitation light L2 and third ASS light power A22.

FIG. 22C is an explanatory diagram illustrating an example of a relationship between the second synthesized excitation light L2 and the third ASS light power A22. The characteristics illustrated in FIG. 22C represent, in the case of a general optical fiber, a change in the third ASS light power A22 (broken line) occurring in the second wavelength band (L band) as a function of a change in the second synthesized excitation light L2. The characteristics represent, in an operational optical fiber, a change in the third ASS light power A22 (solid line) occurring in the second wavelength band (L band) as a function of a change in the second synthesized excitation light L2. The characteristics illustrated in FIG. 22C represent the third model formula for use in calculation of the third ASS light power A22. The operational optical fiber may suppress the third ASS light power A22 compared with the general optical fiber.

Figure 22D:
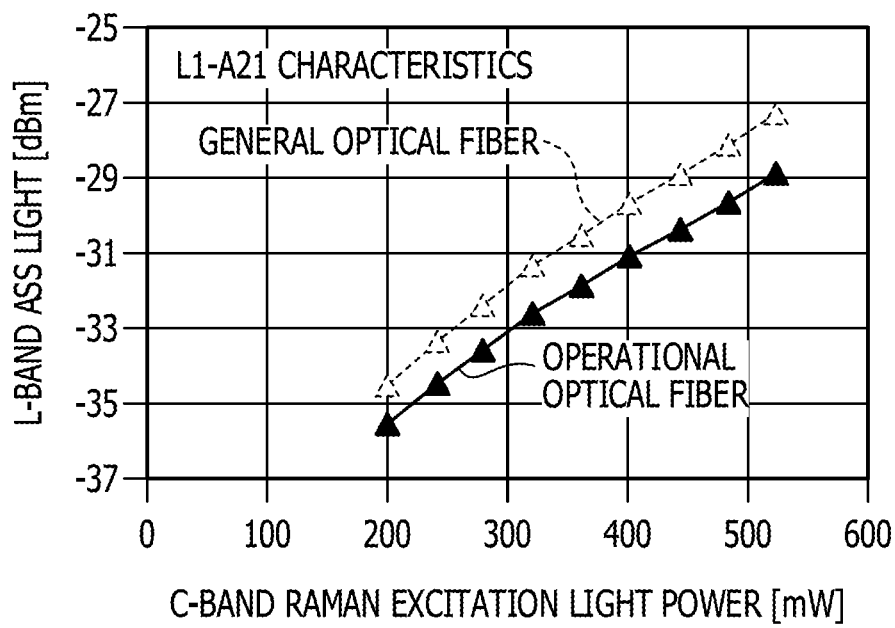
FIG. 22D is an explanatory diagram illustrating an example of a relationship between the first synthesized excitation light L1 and fourth ASS light power A21.
Figure 23A:
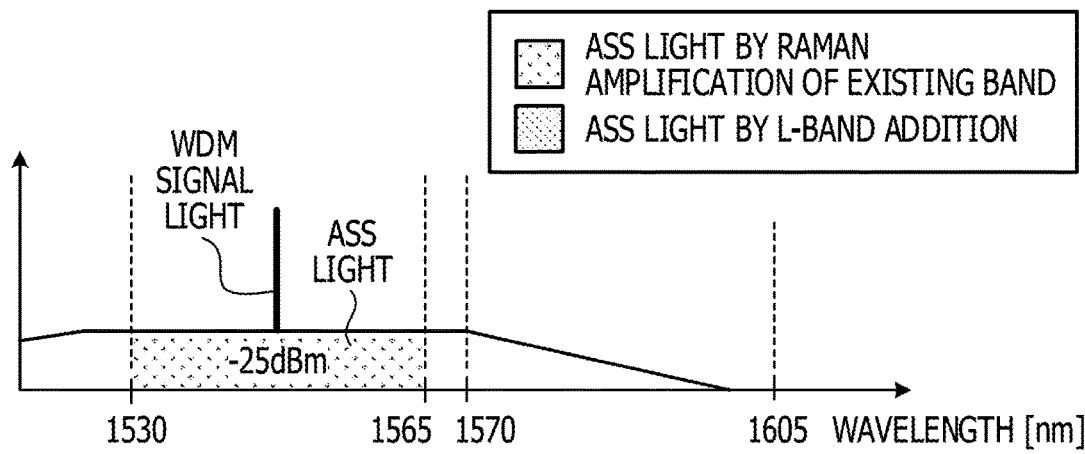
FIG. 23A is an explanatory diagram illustrating an example of wavelength characteristics of WDM signal light power and ASS light power for Raman amplification in a C band that is an existing band.
Figure 23B:
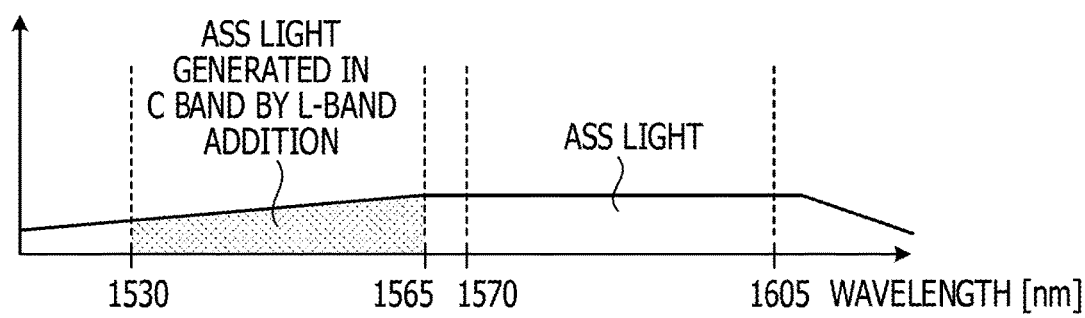
FIG. 23B is an explanatory diagram illustrating an example of wavelength characteristics of WDM signal light power and ASS light power for Raman amplification in an L band that is an added band.
Figure 23C:
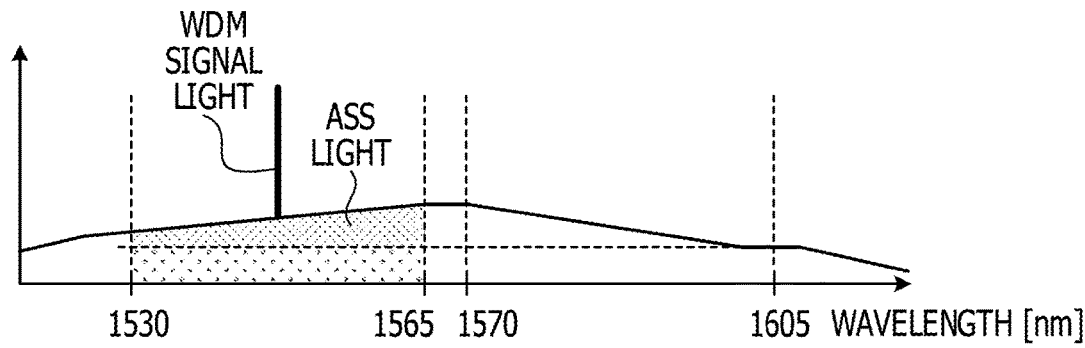
FIG. 23C is an explanatory diagram illustrating an example of wavelength characteristics of WDM signal light power and ASS light power for Raman amplification in the C band and L band.
Figure 24A:
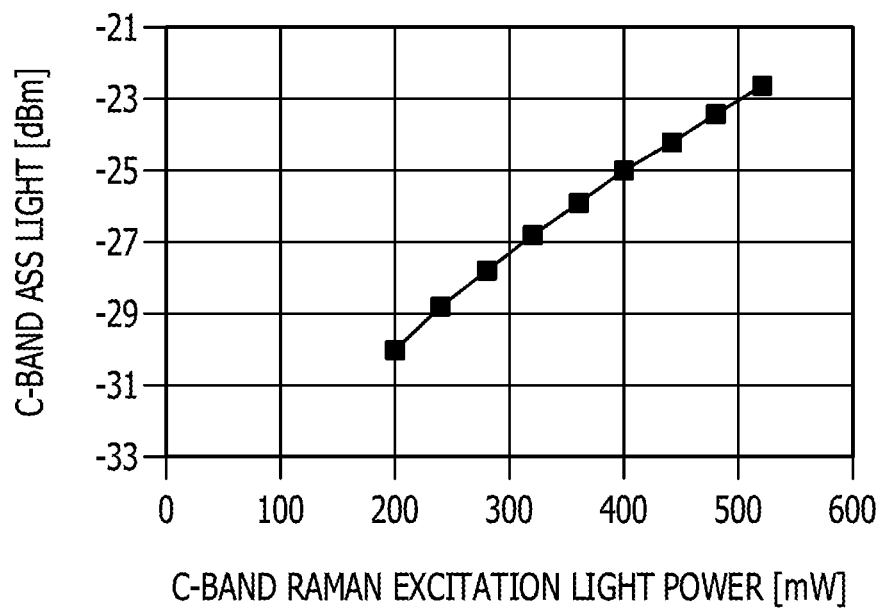
FIG. 24A is an explanatory diagram illustrating an example of ASS light power generated in the existing C band for each excitation light power for Raman amplification in the existing C band.
Figure 24B:
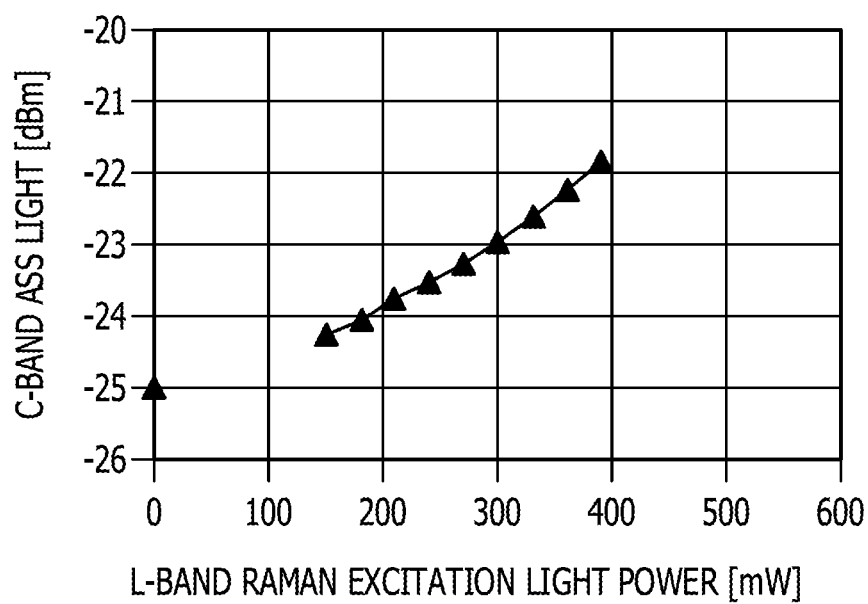
FIG. 24B is an explanatory diagram illustrating an example of ASS light power in the existing C band by addition of L-band excitation light.
Figure 25:
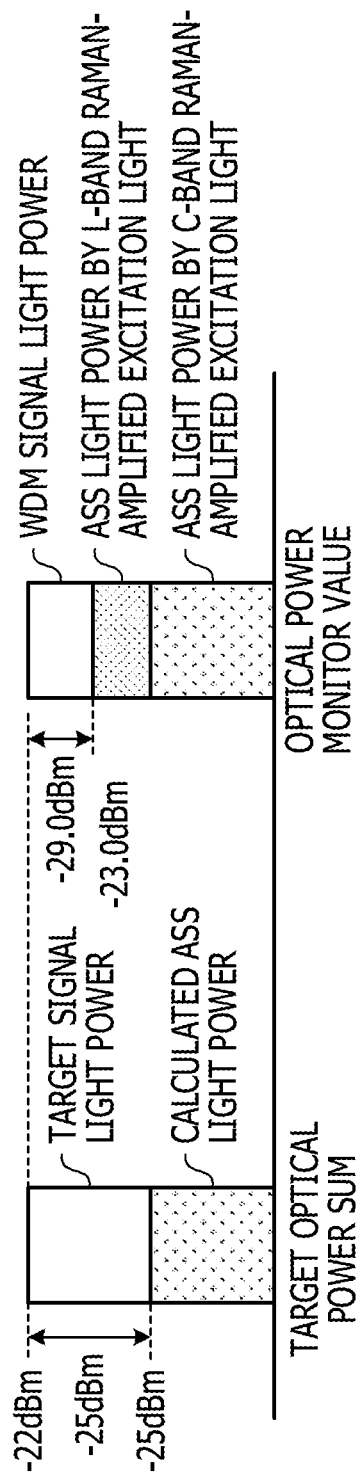
FIG. 25 is an explanatory diagram illustrating an example of a problem caused in the event of addition of the L-band excitation light for amplification of the added L band.

FIG. 22D is an explanatory diagram illustrating an example of a relationship between the first synthesized excitation light L1 and the fourth ASS light power A21. The characteristics illustrated in FIG. 22D represent, in the case of a general optical fiber, a change in the fourth ASS light power A21 (broken line) occurring in the second wavelength band (L band) as a function of a change in the first synthesized excitation light L1. The characteristics represent, in an operational optical fiber, a change in the fourth ASS light power A21 (solid line) occurring in the second wavelength band (L band) as a function of a change in the first synthesized excitation light L1. The characteristics illustrated in FIG. 22D represent the fourth model formula for use in calculation of the fourth ASS light power A21. The operational optical fiber may suppress the fourth ASS light power A21 compared with the general optical fiber.

At the preparatory stage for starting the operation of the first wavelength band (C band), a correction model formula may be determined based on the correlation between the excitation light power and the ASS light power in the general optical fiber and the correlation between the excitation light power and the ASS light power measured in the operational optical fiber. The correction model formula is a model formula related to a difference in the first ASS light power A11 between the general optical fiber and the actual transmission optical fiber 2 with respect to the excitation light power. In this case, the correction model formula may be stored in a correction memory.

The first to fourth determination sections 300A to 300D uses the correction model formula stored in the correction memory and the model formulas for the general optical fiber stored in the first to fourth memories 320A to 320D to determine first to fourth model formulas to be actually operated. The first to fourth determination sections 300A to 300D may store the determined first to fourth model formulas in the first to fourth memories 320A to 320D.

The first to fourth operation sections 330A to 330D may use the corrected model formula and the excitation light power of the first excitation light or the second excitation light to calculate the ASS light power of the first wavelength band and the ASS light power of the second wavelength band.

In the above embodiments, the first wavelength band is set as the C band and the second wavelength band is set as the L band. However, the first wavelength band may be set as the L band and the second wavelength band may be set as the C band, and thus the configuration may be changed accordingly. The wavelength band is not limited to the C band and the L band, but S, O, E, and U bands, for example, may also be applied, and thus the configuration may be changed accordingly. The original band (O band) has a wavelength band of 1260 nm to 1360 nm, the extended band (E band) has a wavelength band of 1360 nm to 1460 nm, and the short band (S band) has a wavelength band of 1460 nm to 1530 nm. The ultra-long band (U band) has a wavelength band of 1625 nm to 1675 nm.

The constituent components of the illustrated respective units do not have to be physically configured as illustrated in the drawings. That is, the specific forms of distribution and integration of the respective units are not limited to those illustrated in the drawings, all or part of which may be functionally or physically distributed and integrated in an optional unit depending on various loads, use conditions, and the like.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A Raman optical amplifier for amplifying signal light by a Raman effect occurring in an amplification medium, comprising:
    a first excitation light source configured to generate first excitation light for amplifying signal light of a first wavelength band among the signal light;
    a second excitation light source configured to generate second excitation light for amplifying signal light of a second wavelength band among the signal light;
    a first optical monitor configured to measure first optical power including first signal light and amplified spontaneous Raman scattering emission (ASS) light of the first wavelength band propagated through the amplification medium; and
    a processor configured to perform:
    determining a first model formula associating the first excitation light power with first ASS light power generated in the first wavelength band with the first excitation light,
    determining a second model formula associating the second excitation light power with second ASS light power generated in the first wavelength band with the second excitation light,
    calculating the first ASS light power corresponding to the first excitation light power, based on the determined first model formula,
    calculating the second ASS light power corresponding to the second excitation light power, based on the determined second model formula,
    calculating the first signal light power by subtracting the calculated first ASS light power and second ASS light power from the first optical power measured by the first optical monitor, and calculating a difference between the calculated first signal light power and first target signal light power, and
    controlling the first excitation light source or the second excitation light source to adjust the first excitation light power or the second excitation light power supplied to the amplification medium, based on the difference between the first signal light power and the first target signal light power.

2. The Raman optical amplifier according to claim 1, wherein
    the processor calculates a first wavelength difference that is a difference between a wavelength of each first excitation light and an end-to-end wavelength within the first wavelength band as well as a second wavelength difference that is a difference between a wavelength of each second excitation light and the end-to-end wavelength within the first wavelength band,
    further comprising:
    a memory configured to store wavelength characteristics of ASS light power generated in the amplification medium for each of the first wavelength difference and the second wavelength difference,
    wherein the processor determines the first model formula for use in calculation of the first ASS light power, based on the calculated first wavelength difference and the ASS light power wavelength characteristics stored in the memory corresponding to the first wavelength difference, and also determines the second model formula for use in calculation of the second ASS light power, based on the calculated second wavelength difference and the ASS light power wavelength characteristics stored in the memory corresponding to the second wavelength difference.

3. The Raman optical amplifier according to claim 1, further comprising:
    a second optical monitor configured to measure second optical power including second signal light and ASS light of the second wavelength band propagated through the amplification medium,
    wherein the processor performs
    determining a third model formula associating the second excitation light power with third ASS light power generated in the second wavelength band with the second excitation light,
    calculating the third ASS light power corresponding to the second excitation light power, based on the determined third model formula,
    calculating the second signal light power by subtracting the calculated third ASS light power from the second optical power measured by the second optical monitor, and calculating a difference between the calculated second signal light power and second target signal light power, and
    controlling the second excitation light source to adjust the second excitation light power supplied to the amplification medium, based on the difference between the second signal light power and the second target signal light power.

4. The Raman optical amplifier according to claim 3, wherein
    the processor performs
    determining a fourth model formula associating the first excitation light power with fourth ASS light power generated in the second wavelength band with the first excitation light,
    calculating the fourth ASS light power corresponding to the first excitation light power, based on the determined fourth model formula,
    calculating the second signal light power by subtracting the calculated third ASS light power and fourth ASS light power from the second optical power measured by the second optical monitor, and calculating a difference between the calculated second signal light power and second target signal light power, and controlling the second excitation light to adjust the second excitation light power supplied to the amplification medium, based on the difference between the second signal light power and the second target signal light power.

5. The Raman optical amplifier according to claim 4, wherein
the processor calculates a third wavelength difference that is a difference between a wavelength of each first excitation light and an end-to-end wavelength within the second wavelength band as well as a fourth wavelength difference that is a difference between a wavelength of each second excitation light and the end-to-end wavelength within the second wavelength band, further comprising:
a memory configured to store wavelength characteristics of the ASS light power for each of the third wavelength difference and the fourth wavelength difference,
wherein the processor determines the third model formula for use in calculation of the third ASS light power, based on the calculated third wavelength difference and the ASS light power wavelength characteristics stored in the memory corresponding to the third wavelength difference, and
the processor also determines the fourth model formula for use in calculation of the fourth ASS light power, based on the calculated fourth wavelength difference and the ASS light power wavelength characteristics stored in the memory corresponding to the fourth wavelength difference.

6. The Raman optical amplifier according to claim 2, wherein
the memory stores the first excitation light wavelength, the second excitation light wavelength, and the ASS light power wavelength characteristics in association with each other, according to a type of an optical fiber to be the amplification medium.

7. The Raman optical amplifier according to claim 5, wherein
the memory stores the first excitation light wavelength, the second excitation light wavelength, and the ASS light power wavelength characteristics in association with each other, according to a type of an optical fiber to be the amplification medium.

8. The Raman optical amplifier according to claim 1, wherein
the processor performs
calculating a frequency difference between the first excitation light and the second excitation light,
calculating a first excitation light power change rate and a second excitation light power change rate by using a Raman effect generated between the first excitation light and the second excitation light, based on the calculated frequency difference, an excitation light power change coefficient by the Raman effect generated between the first excitation light and the second excitation light, and the first excitation light power and the second excitation light power supplied to the amplification medium,
calculating the first ASS light power corresponding to the first excitation light power, based on the first excitation light power change rate, and
calculating the second ASS light power corresponding to the second excitation light power, based on the second excitation light power change rate.

9. The Raman optical amplifier according to claim 8, further comprising:

a memory configured to store the excitation light power change coefficient according to a type of an optical fiber to be the amplification medium,
wherein the processor reads the excitation light power change coefficient from the memory according to the type of the optical fiber to be the amplification medium.

10. The Raman optical amplifier according to claim 1, further comprising:
a first out-of-band monitor configured to measure first out-of-band ASS light power generated outside the first wavelength band,
wherein the processor performs
calculating a difference between the first out-of-band ASS light power measured by the first out-of-band monitor and first target ASS light power determined from a desired Raman gain of the first wavelength band,
controlling the first excitation light source or the second excitation light source to adjust the first excitation light power or the second excitation light power supplied to the amplification medium, based on the difference between the first out-of-band ASS light power and the first target ASS light power,
determining the first model formula corresponding to the first excitation light power adjusted based on the difference between the first out-of-band ASS light power and the first target ASS light power, and
determining the second model formula corresponding to the second excitation light power adjusted based on the difference between the first out-of-band ASS light power and the first target ASS light power.

11. The Raman optical amplifier according to claim 1, further comprising:
a second out-of-band monitor configured to measure second out-of-band ASS light power generated outside the second wavelength band,
wherein the processor performs
calculating a difference between the second out-of-band ASS light power measured by the second out-of-band monitor and second target ASS light power determined from a desired Raman gain of the second wavelength band,
controlling the first excitation light source or the second excitation light source to adjust the first excitation light power or the second excitation light power supplied to the amplification medium, based on the difference between the second out-of-band ASS light power and the second target ASS light power,
determining a third model formula corresponding to the first excitation light power adjusted based on the difference between the second out-of-band ASS light power and the second target ASS light power, and
determining a fourth model formula corresponding to the second excitation light power adjusted based on the difference between the second out-of-band ASS light power and the second target ASS light power.

12. The Raman optical amplifier according to claim 1, wherein
in the model formula for managing the first excitation light power, the second excitation light power, wavelength characteristics of first ASS light power generated in the first wavelength band, wavelength characteristics of second ASS light power generated in the second wavelength band, according to characteristics of a type of an optical fiber as the amplification medium, a coefficient in the model formula is corrected based on the first excitation light power and the first ASS light power measured in a preparatory stage before start of operation of the first wavelength band.

13. A Raman optical amplification method using a Raman optical amplifier for amplifying signal light by a Raman effect occurring in an amplification medium, the Raman optical amplification method comprising:

generating first excitation light for amplifying signal light of a first wavelength band among the signal light;

generating second excitation light for amplifying signal light of a second wavelength band among the signal light;

measuring first optical power including first signal light and amplified spontaneous Raman scattering emission (ASS) light of the first wavelength band propagated through the amplification medium;

determining a first model formula associating the first excitation light power with first ASS light power generated in the first wavelength band with the first excitation light;

determining a second model formula associating the second excitation light power with second ASS light power generated in the first wavelength band with the second excitation light;

calculating the first ASS light power corresponding to the first excitation light power, based on the determined first model formula;

calculating the second ASS light power corresponding to the second excitation light power, based on the determined second model formula;

calculating the first signal light power by subtracting the calculated first ASS light power and second ASS light power from the measured first optical power, and calculating a difference between the calculated first signal light power and first target signal light power; and adjusting the first excitation light power or the second excitation light power supplied to the amplification medium, based on the difference between the first signal light power and the first target signal light power.

14. The Raman optical amplification method according to claim 13, further comprising:

calculating a first wavelength difference that is a difference between a wavelength of each first excitation light and an end-to-end wavelength within the first wavelength band as well as a second wavelength difference that is a difference between a wavelength of each second excitation light and the end-to-end wavelength within the first wavelength band, and storing, in a memory, wavelength characteristics of ASS light power generated in the amplification medium for each of the first wavelength difference and the second wavelength difference, wherein the determining the first model formula includes determining the first model formula for use in calculation of the first ASS light power, based on the calculated first wavelength difference and the ASS light power wavelength characteristics stored in the memory corresponding to the first wavelength difference, and the determining the second model formula includes determining the second model formula for use in calculation of the second ASS light power, based on the calculated second wavelength difference and the ASS light power wavelength characteristics stored in the memory corresponding to the second wavelength difference.

* * * * *